(12) United States Patent
Chang et al.

(10) Patent No.: US 6,617,649 B2
(45) Date of Patent: Sep. 9, 2003

(54) LOW SUBSTRATE-NOISE ELECTROSTATIC DISCHARGE PROTECTION CIRCUITS WITH BI-DIRECTIONAL SILICON DIODES

(75) Inventors: Chyh-Yih Chang, Hsinghuang (TW); Ming-Dou Ker, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/973,745

(22) Filed: Oct. 11, 2001

(65) Prior Publication Data

US 2002/0064007 A1 May 30, 2002

Related U.S. Application Data

(63) Continuation-in-part of application No. 09/749,377, filed on Dec. 28, 2000.

(51) Int. Cl.[7] .............................................. H01L 23/62
(52) U.S. Cl. ...................... 257/355; 257/356; 257/360; 257/546
(58) Field of Search ................................ 257/355, 360, 257/356, 546

(56) References Cited

U.S. PATENT DOCUMENTS

| | | |
|---|---|---|
| 4,939,616 A | 7/1990 | Rountree |
| 5,012,317 A | 4/1991 | Rountre |
| 5,225,702 A | 7/1993 | Chatterjee |
| 5,336,908 A * | 8/1994 | Roberts |
| 5,359,219 A * | 10/1994 | Hwang |
| 5,453,384 A | 9/1995 | Chatterjee |
| 5,465,189 A | 11/1995 | Polgreen et al. |
| 5,502,328 A | 3/1996 | Chen et al. |
| 5,519,242 A | 5/1996 | Avery |
| 5,581,104 A | 12/1996 | Lowrey et al. |
| 5,629,544 A | 5/1997 | Voldman et al. |
| 5,631,793 A | 5/1997 | Ker et al. |
| 5,646,808 A | 7/1997 | Nakayama |
| 5,654,862 A | 8/1997 | Worley et al. |
| 5,719,737 A | 2/1998 | Maloney |
| 5,754,381 A | 5/1998 | Ker |
| 5,807,791 A | 9/1998 | Bertin et al. |
| 5,811,857 A | 9/1998 | Assaderaghi et al. |
| 5,831,312 A * | 11/1998 | Wen |
| 5,907,462 A | 5/1999 | Chatterjee et al. |
| 5,910,874 A | 6/1999 | Iniewski et al. |
| 5,923,067 A * | 7/1999 | Voldman |
| 5,932,918 A | 8/1999 | Krakauer |
| 5,940,258 A | 8/1999 | Duvvury |
| 5,990,520 A | 11/1999 | Noorlag et al. |
| 6,015,992 A | 1/2000 | Chatterjee et al. |
| 6,034,397 A | 3/2000 | Voldman |
| 6,081,002 A | 6/2000 | Amerasekera et al. |
| 6,351,363 B1 * | 2/2002 | Wang |
| 6,437,407 B1 * | 8/2002 | Ker et al. |

OTHER PUBLICATIONS

M–D. Ker, et al., "CMOS On–Chip ESD Protection Design with Substrate–triggering Technique," Proc. of ICECS, vol. 1, pp. 273–276, 1998.

(List continued on next page.)

Primary Examiner—Stephen D. Meier
(74) Attorney, Agent, or Firm—Finnegan, Henderson, Farabow, Garrett & Dunner, L.L.P.

(57) ABSTRACT

An integrated circuit device that includes a plurality of electrostatic discharge clamp circuits, variously coupled to VDD, VSS and transistor, having at least one bi-directional silicon diode that includes a first silicon diode and a second silicon diode, wherein an n-type portion of the first silicon diode is coupled to a p-type portion of the second silicon diode and a p-type portion of the first silicon diode is coupled to an n-type portion of the second silicon diode, responsive to either a positive electrostatic discharge or a negative electrostatic discharge to provide electrostatic discharge protection.

28 Claims, 18 Drawing Sheets

OTHER PUBLICATIONS

C. Duvvury et al., "Dynamic Gate Coupling for NMOS for Efficient Output ESD Protection", Proc. of IRPS. pp. 141–150, 1992.

N. K. Verghese and D. Allstot, "Verification of RF and Mixed–Signed Integrated Circuits for Substrate Coupling Effects", in *Proc. of IEEE Custom Integrated Circuits Conf.*, 1997, pp. 363–370.

M.Xu, D. Su, D. Shaeffer, T.Lee, and B. Wooley, "Measuring and Modeling the Effects of Substrate Noise on LNA for a CMOS GPS Receiver," *IEEE Journal of Solid–State Circuits*, vol. 36, pp. 473–485, 2001.

R. Gharpurey, "A Methodology for Measurement and Characterization of Substrate Noise in High Frequency Circuits," in *Proc. of IEEE Custom Integrated Circuits Conf.*, 1999, pp. 487–490.

M. Nagata, J. Nagai, K. Hijikata, T. Morie, and A. Iwata, PhysicalDesign Guides for Substrate Noise Reduction in CMOS Digital Circuits, *IEEE Journal of Solid–State Circuits*, vol. 36, pp. 539–549, 2001.

M.–D. Ker, T–Y, Chen, C–Y. Wu, and H.–H. Chang, ESD Protection Design on Analog Pin With Very Low Input Capacitance for High–Frequency or Current–Mode Applications, *IEEE Journal of Solid–State Circuits*, vol. 35, pp. 1194–1199, 2000.

M.–D. Ker, Whole–Chip ESD Protection Design with Efficient VDD–to–VSS ESD Clamp Circuit for Submicron CMOS VLSI, *IEEE Trans. on Electron Devices*, vol. 46, pp. 173–183, 1999.

C. Richier, P. Salome, G. Mabboux, I. Zaza, A. Juge, and P. Mortini, Investigation on Different ESD Protection Strategies Devoted to 3.3V RF Applications (2 (GHz) in a 0.18$\mu$m CMOS Process, in Proc. of EOS/ESD Symp., 2000, pp. 251–259.

T.–Y. Chen and M.–D. Ker, "Design on ESD Protection Circuit With Low and Constant Input Capacitance," *in Proc. of IEEE Int. Symp. on Quality Electronic Design*, 2001, pp. 247–247.

M.–D. Ker, T.–Y. Chen, C.–Y. Wu, and H.–H. Chang, ESD Protection Design on Analog Pin With Very Low Input Capacitance for RF or Current–Mode Applications, *IEEE Journal of Solid–State Circuits*, vol. 35, pp. 1194–1199, 2000.

S. Voldman, et al., "Semiconductor Process and Structural Optimization of Shallow Trench Isolation–Defined and Polysilicon–Bound Source/Drain Diodes for ESD Networks," in Proc. of EOS/ESD Symp., 1998, pp. 151–160.

S. Voldman, et al., "Analysis of Snubber–Clamped Diode–String Mixed Voltage Interface ESD Protection Network for Advanced Microprocessors," in Proc. of EOS/ESD symposium, 1995, pp. 43–61.

M.J. Pelgrom, et al., "A 3/5 V Compatible I/O Buffer," IEEE Journal of Solid–State Circuits, vol. 30, No. 7, pp. 823–825, Jul. 1995.

G.P. Singh, et al., "High–Voltage–Tolerant I/OBuffers with Low–Voltage CMOS Process," IEEE Journal of Solid–State Circuits, vol. 34, No. 11, pp. 1512–1525, Nov. 1999.

H. Sanchez, et al., A Versatile 3.3/2.5/1.8–V CMOS I/O Driver Built in 02. –$\mu$m, 3.5–nm Tox, 1.8–V CMOS Technology, IEEE Journal of Solid–State Circuits, vol. 34 No. 11.pp. 1501–1511, Nov. 1999.

\* cited by examiner

FIG. 16A  FIG. 16B

LOW SUBSTRATE-NOISE ELECTROSTATIC DISCHARGE PROTECTION CIRCUITS WITH BI-DIRECTIONAL SILICON DIODES

DESCRIPTION OF THE INVENTOIN

This is a continuation-in-part of application Ser. No. 09/749,377 filed Dec. 28, 2000 pending at time of issue.

FIELD OF THE INVENTION

This invention pertains in general to a semiconductor circuit, and, more particularly, to an electrostatic discharge protection circuit incorporating bi-directional silicon diodes.

BACKGROUND OF THE INVENTION

A semiconductor integrated circuit (IC) is generally susceptible to an electrostatic discharge (ESD) event, which may damage or destroy the IC. An ESD event refers to a phenomenon of electrical discharge of a current (positive or negative) for a short duration in which a large amount of current is provided to the IC. In addition, an ESD event can occur between (a) a pin of the IC and VSS (ground), (b) between a pin and VDD (power), (c) among different pins of the IC, and (d) between VDD and VSS, as shown in FIGS. 1A–1D, respectively. Common sources of ESD include personnel and processing equipment. It is known that the susceptibility of a device to an ESD event may be determined by simulations with one of three models, Human Body Model (HBM), Machines Model (MM) and Charged Device Model (CDM). These models, although do not necessarily simulate the susceptibility of real life situations, are used to establish baselines of susceptibility data.

The ESD Association Standard for the Development of an Electrostatic Discharge Control Program for—Protection of Electrical and Electronic Parts, Assemblies and Equipment (Excluding Electrically Initiated Explosive Device), ANSI/ESD-S20.20-1999 (Aug. 4, 1999), provides for ESD sensitivity testings for each of the three models. The HBM model represents the discharge from the fingertip of a standing individual delivered to the conductive leads of the device. FIG. 2 shows an HBM model ESD test circuit, modeled by a 100 pF capacitor, representing the effective capacitance of the human body, discharged through a switching component and 1,500 ohm series resistor, representing the effective resistance of the human body, into the device under tests. The discharge is a double exponential waveform with a rise time of 2–10 nanoseconds (nS) and a pulse duration of approximately 150 nS. Similar testing parameters are set forth in MIL-STD-883E method 3015.7 (Mar. 22, 1989), and JEDEC Standard for Electrostatic Discharge (ESD) Sensitivity Testing Human Body Model (HBM), JESD22-A114-B (June 2000). An example discharge voltage is approximately 2,000 volts at a peak current of approximately 1.33 amperes (A).

The MM model represents a rapid discharge from items such as a charged board assembly, charged cables, or the conduction arm of an automatic tester. The effective capacitance is approximately 200 pF discharged through a 500 nH inductor directly into the device because the effective resistance of the machine is approximately zero. The discharge is a sinusoidal decaying waveform having a peak current of approximately 8 A with a rise time of 5–8 nS and a period of approximately 80 nS. The MM model is also described in EIA/JEDEC Standard, Test Method A115-A for Electrostatic Discharge (ESD) Sensitivity Testing Machine Model (MM), EIA/JESD22-A115-A (October 1997).

The CDM model is device dependent, and describes a phenomenon when a device acquires charge through frictional or electrostatic induction processes and then abruptly touches a grounded object or surface. The waveform rise time is generally less than 200 picoseconds, and the entire ESD event can take place in less than 2.0 nS. Current levels can reach several tens of amperes during discharge. The CDM model is also described in JEDEC Standard, Field-Induced Charged-Device Model Test Method for Electrostatic-Discharge-Withstand Thresholds of Microelectronic Components, JESD22-C101-A (June 2000).

The ESD Association Standard for the Development of an Electrostatic Discharge Control Program for—Protection of Electrical and Electronic Parts, Assemblies and Equipment (Excluding Electrically Initiated Explosive Device), ANSI/ESD-S20.20-1999 (Aug. 4, 1999), MIL-STD-883E method 3015.7 (Mar. 22, 1989), JEDEC Standard for Electrostatic Discharge (ESD) Sensitivity Testing Human Body Model (HBM), JESD22-A114-B (June 2000), EIA/JEDEC Standard, Test Method A115-A for Electrostatic Discharge (ESD) Sensitivity Testing Machine Model (MM), EIA/JESD22-A115-A (October 1997), and JEDEC Standard, Field-Induced Charged-Device Model Test Method for Electrostatic-Discharge-Withstand Thresholds of Microelectronic Components, JESD22-C101-A (June 2000) are hereby incorporated by reference.

In commercial applications, a device is expected to withstand ±2,000 volts in ESD for HBM models, ±200 volts for MM models, and ±1000 volts for CDM models. FIG. 3 is a plot that shows the characteristics of HBM, MM and CDM discharges. As shown in FIG. 3, the CDM discharge reaches a peak current of approximately 15A in less than 1 nS, and the discharge is complete within approximately 10 nS.

Many schemes have been implemented to protect an IC from the three modeled ESD events. A common protection scheme is using a parasitic transistor associated with an n-type metal-oxide semiconductor (MOS) with the source coupled to ground and the drain connected to the pin of the ESD protection device. Diodes or diode-coupled transistors have been used for ESD protection in radio-frequency (RF) applications. In a RF IC, an on-chip ESD circuit should ideally provide robust ESD protection, while exhibiting minimum parasitic input capacitance and low voltage-dependency. In a deep-submicron complementary metal-oxide semiconductor (CMOS) process technology with shallow-trench isolations (STIs), a diode has been used for ESD protection and is generally formed contiguous with either an $N^+$ or $P^+$ diffusion region in a semiconductor substrate. FIG. 4A shows a cross-sectional view of a known diode ESD protection structure formed in an IC. Referring to FIG. 4A, a $P^+$ diffusion region is bound by STIs on either side, and therefore the diode formed by the STI is also known as an STI-bound diode. The STI-bound diode exhibits a bottom capacitance, $C_{bottom}$. However, an STI-bound diode has been found to have significant leakage current due to an interference between a silicide layer (not shown) of the $P^+$ diffusion region and the STIs around the $P^+$ region.

FIG. 4B shows a cross-sectional view of another known diode ESD protection structure, known as a polysilicon-bound diode, introduced to address the leakage current problem with an STI-bound diode. The $P^+$ diffusion region in a polysilicon-bound diode is now defined by a polysilicon gate, and therefore the leakage current from the edges of STIs is eliminated. However, the total parasitic capacitance of the polysilicon-bound diode is larger than that of the STI-bound diode because of the addition of the sidewall junction capacitance of the $P^+$ diffusion region.

FIG. 5 is a circuit diagram showing a known ESD protection scheme using dual diodes. Referring to FIG. 5, the combination of the dual-diode structures and VDD-to-VSS ESD clamp circuit provides a path for an ESD current 2 to discharge, instead of through the internal circuits. When ESD current 2 is provided to a signal pad PAD1, and with a signal pad PAD2 relatively grounded, ESD current 2 is conducted to VDD through Dp1. ESD current 2 is discharged to VSS through the VDD-to-VSS ESD clamp circuit and flows out of the IC from Dn2 to PAD2. Diode Dp1 has a capacitance of Cp1 and diode Dn1 has a capacitance of Cn1. The total input capacitance $C_{in}$ primarily comes from the parasitic junction capacitance of diodes, and is calculated as follows:

$$C_{in}=Cp1+Cn1$$

wherein Cp1 and Cn1 are parasitic junction capacitances of diodes Dp1 and Dn1, respectively.

FIG. 6 is a plot showing the relationship between a pad voltage and parasitic input capacitance of the circuit shown in FIG. 5. Referring to FIG. 6, when the voltage on the pad increases, the parasitic junction capacitance of Dp1 increases and the parasitic junction capacitance of Dn1 decreases. Therefore, the total input parasitic capacitance $C_{in}$ is nearly constant. This characteristic is important in RF applications. However, the total parasitic capacitance of a polysilicon-bound diode, as compared to an STI-bound diode, is increased because of the addition of a sidewall capacitance, $C_{sidewall}$, as shown in FIG. 4B.

SUMMARY OF THE INVENTION

In accordance with the invention, there is provided an integrated circuit device that includes at least one bi-directional silicon diode having a first silicon diode and a second silicon diode, wherein an n-type portion of the first silicon diode is coupled to a p-type portion of the second silicon diode and a p-type portion of the first silicon diode is coupled to an n-type portion of the second silicon diode, and wherein the at least one bi-directional silicon diode is responsive to one of a positive electrostatic discharge or a negative electrostatic discharge.

In one aspect of the invention, the at least one bi-directional silicon diode includes one or more serially coupled bi-directional silicon diodes.

Also in accordance with the present invention, there is provided an electrostatic discharge protection circuit that includes at least one bi-directional silicon diode having a first silicon-on-insulator diode and a second silicon-on-insulator diode, wherein an n-type portion of the first silicon-on-insulator diode is coupled to a p-type portion of the second silicon-on-insulator diode and a p-type portion of the first silicon-on-insulator diode is coupled to an n-type portion of the second silicon-on-insulator diode, and wherein the at least one bi-directional silicon diode is responsive to one of a positive electrostatic discharge or a negative electrostatic discharge.

Further in accordance with the present invention, there is provided an integrated circuit that includes a signal pad, a first voltage source, and a first electrostatic discharge clamp circuit, coupled to the first voltage source, having at least one bi-directional silicon diode including a first silicon diode and a second silicon diode, wherein an n-type portion of the first silicon diode is coupled to a p-type portion of the second silicon diode and a p-type portion of the first silicon diode is coupled to an n-type portion of the second silicon diode, and wherein the at least one bi-directional silicon diode is responsive to one of a positive electrostatic discharge or a negative electrostatic discharge.

In one aspect of the invention, the first voltage source is VDD, and the first electrostatic discharge clamp circuit is coupled to the signal pad to protect the circuit from at least a human body model electrostatic discharge or machine model electrostatic discharge.

In another aspect of the invention, there also includes a second electrostatic discharge clamp circuit having at least one bi-directional silicon diode including a third silicon diode and a fourth silicon diode, wherein an n-type portion of the third silicon diode is coupled to a p-type portion of the fourth silicon diode and a p-type portion of the third silicon diode is coupled to an n-type portion of the fourth silicon diode, and wherein the second electrostatic discharge clamp circuit is coupled to VDD and a bulk of a first transistor at one end and to a gate of the first transistor at another end to protect the first transistor from at least a charged device model electrostatic discharge.

In yet another aspect of the invention, the first voltage source is VSS, and the first electrostatic discharge clamp circuit is coupled to the signal pad to protect the circuit from at least a human body model electrostatic discharge or machine model electrostatic discharge.

In still another aspect of the invention, the first voltage source is VDD, and the first electrostatic discharge clamp circuit is coupled to a bulk at one end and to a gate at another end of a first transistor to protect the first transistor from at least a charged device model electrostatic discharge.

In another aspect of the invention, there additionally includes a second voltage source coupled to the first electrostatic discharge clamp circuit at a different end than the first voltage source, wherein the first voltage source is VDD and the second voltage source is VSS for providing electrostatic discharge protection.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 16A is a circuit diagram of one embodiment of an ESD protection circuit using silicon diodes of the present invention;

FIG. 16B is a circuit diagram of one embodiment of an ESD protection circuit using stacked silicon diodes of the present invention;

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

In accordance with the present invention, there is provided a bi-directional silicon diode (SD) for ESD protection of both positive and negative electrostatic discharge events.

The bi-directional SD of the present invention include at least one pair of silicon diodes coupled in opposite polarity to each other, i.e., the n-type portion of one silicon diode is coupled to the p-type portion of the other silicon diode, and vice versa. Unlike conventional diodes, an SD does not have a bottom junction capacitance and therefore exhibits a relatively smaller junction capacitance. In addition, because an SD is disposed over shallow trench isolations (STIs) in a silicon substrate, the silicon area used by the SD is reduced, which reduces cost. The SD of the present invention additionally provides a function, and therefore provides more flexibility in RF IC applications.

Figure 7:
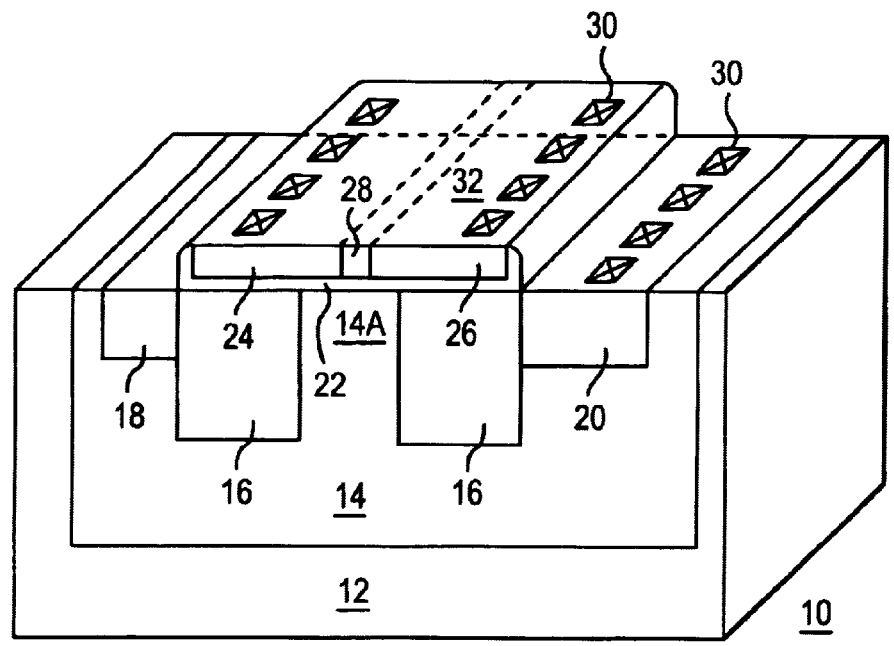
FIG. 7 shows a cross-sectional view of a silicon diode in accordance with one embodiment of the present invention.

FIG. 7 shows a cross-sectional view of an SD in accordance with one embodiment of the present invention. Referring to FIG. 7, an integrated circuit 10 includes a semiconductor substrate 12 and a well region 14 formed inside semiconductor substrate 12. Two isolation structures 16 are formed inside well region 14 and are spaced apart from one another. Isolation structures may be conventional STIs used for device isolation. Integrated circuit 10 also includes a diffused region 20 adjacent one of STIs 16. Diffused region 20 is doped with the same type of impurity as well region 14. Integrated circuit 10 may also include another diffused region 18 adjacent one of STIs 16. In one embodiment of the invention, semiconductor substrate 12 is a p-type substrate, well region 14 is an n-well, and diffused region 20 is an n-type diffused region. The optional diffused region 18 is a p-type diffused region.

A dielectric layer 22 is formed over the well region 14, overlapping STIs 16 and a portion of well region 14A disposed between STIs 16. Dielectric layer 22 may be an oxide layer. A layer of silicon 32, subsequently becomes an SD, is disposed over dielectric layer 22. Silicon layer 32 includes a p-type portion 24, an n-type portion 26, and a center portion 28 disposed between p-type portion 24 and n-type portion 26. P-type portion 24 overlaps one of STIs 16 and n-type portion 26 overlaps the other one of STIs 16. Center portion 28 overlaps well region portion 14A. In one embodiment, center portion 28 of silicon layer 32 is doped with an n-type impurity having a doped concentration lower than that of n-type portion 26. In another embodiment, center portion 28 of silicon layer 32 is doped with a p-type impurity having a doped concentration lower than that of p-type portion 24. In addition, in an embodiment in which diffused region 20 is an n-type diffused region, diffused region 20 is adjacent one of STIs 16 and n-type portion 26 of silicon layer 32. A plurality of contacts 30 are formed on diffused region 20, p-type portion 24 and n-type portion 26 of silicon layer 32.

In operation, SD 32 responds to ESD pulses to provide electrostatic discharge protection. Furthermore, well region 14 can be biased to control SD 32. In one embodiment, diffused region 20 is biased to cause well region 14 to be biased to control SD 32 for providing electrostatic discharge protection.

Figure 8:
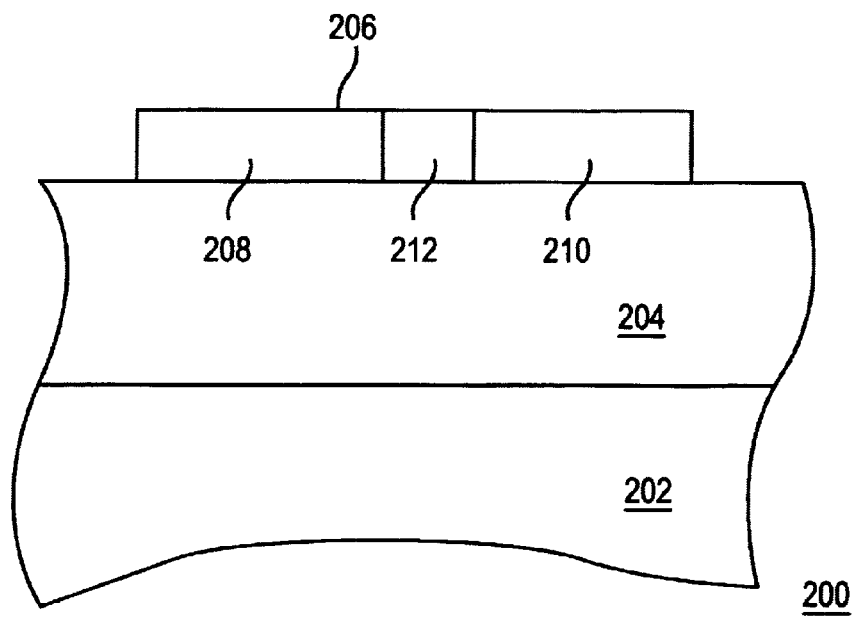
FIG. 8 shows a cross-sectional view of a silicon diode in accordance with another embodiment of the present invention.

FIG. 8 shows a cross-sectional view of a silicon diode in accordance with another embodiment of the present invention. Referring to FIG. 8, an integrated circuit 200 includes a semiconductor substrate 202 and a dielectric layer 204 formed over semiconductor substrate 202. Dielectric layer 204 may comprise a conventional STI. Integrated circuit 200 also includes a layer of silicon 206, subsequently becomes a silicon diode, is disposed over dielectric layer 204. Silicon layer 206 includes a p-type portion 208, an n-type portion 210, and a center portion 212 disposed between p-type portion 208 and n-type portion 210. In one embodiment, center portion 212 is undoped and may be fabricated in a salicide CMOS process. The silicon diode thus formed has no junction in semiconductor substrate 202, eliminating substrate noise coupling. In one embodiment, the integrated circuit 200 further includes an insulator (not shown) between silicon layer 206 and dielectric layer 204.

Figure 9:
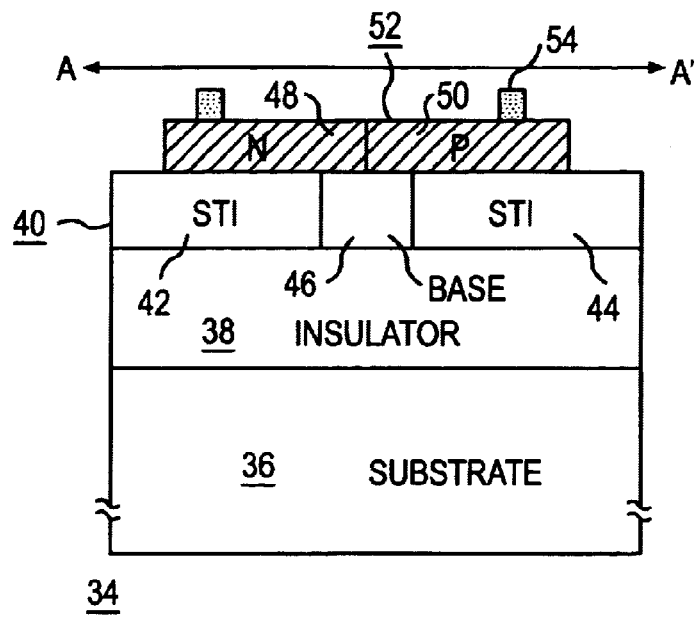
FIG. 9 shows a cross-sectional view of a silicon-on-insulator silicon diode in accordance with one embodiment of the present invention.

FIG. 9 shows a cross-sectional view of a silicon-on-insulator silicon diode in accordance with another embodiment of the present invention. Referring to FIG. 9, the SD of the present invention is implemented in a silicon-on-insulator (SOI) CMOS integrated circuit 34. An insulator 38 is disposed over a semiconductor substrate 36. A silicon layer 40 is disposed over insulator layer 38 and includes an isolation structure 42 formed inside silicon layer 40 and an isolation structure 44 formed inside silicon layer 40 and spaced apart from isolation structure 42. Silicon layer 40 also includes a base portion 46 disposed between and contiguous with isolation structures 42 and 44. In one embodiment of the present invention, substrate 36 is a p-type substrate, and isolation structures 42 and 44 are STIs.

A dielectric layer (not shown) is disposed over silicon layer 40, and a layer of polysilicon 52 is disposed over the dielectric layer. Polysilicon layer 52 may also be a silicon layer. Polysilicon layer 52 includes a p-type portion 50, an n-type portion 48 and a center portion (not shown) disposed between and contiguous with the p-type and n-type portions 48 and 50. In addition, p-type portion 50 overlaps isolation structure 44 and n-type portion 48 overlaps isolation structure 42. The center portion of polysilicon layer 52 overlaps base portion 46. Integrated circuit 34 may additional comprise a diffused region (not shown) inside silicon layer 40 adjacent one of isolation structures 42 and 44. Integrated circuit 34 also comprises a plurality of contacts 54.

Figure 10:
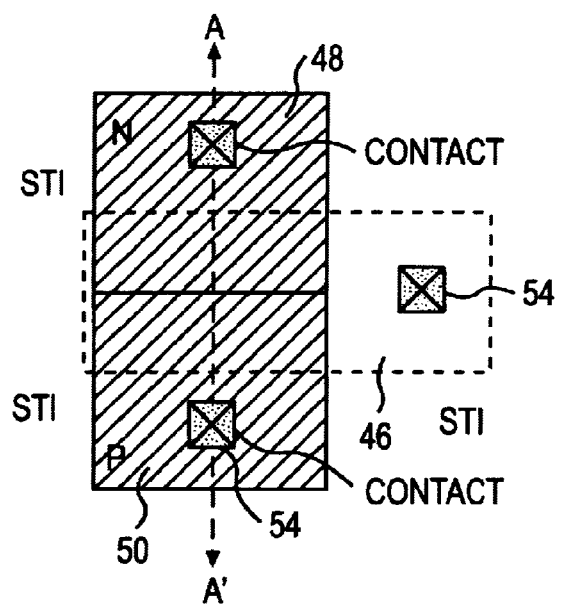
FIG. 10 is a layout diagram of the silicon-on-insulator silicon diode of FIG. 9.

In operation, insulator layer 38 isolates devices in SOI integrated circuit 34. Thus, silicon diode 52 of the present invention is adapted to be biased at the base. The bias supply for silicon-on-insulator silicon diode 52 may be located on one or both sides of silicon-on-insulator silicon diode 52 in the form of a diffused region adjacent one of isolation structure 42 and 44. Base portion 46 of silicon layer 40 may also be biased to control silicon-on-insulator silicon diode 52 to provide electrostatic discharge protection. Therefore, this embodiment of the present invention appropriately named a silicon-on-insulator silicon diode. FIG. 10 is a layout diagram of silicon-on-insulator silicon diode 52 as shown in FIG. 9 along the A–A' direction.

Figure 11A:
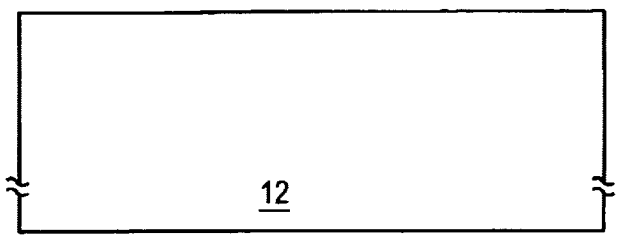
FIGS. 11A–11H are cross-sectional views of the steps in a method of forming a silicon diode with an n-type center region.
Figure 11B:
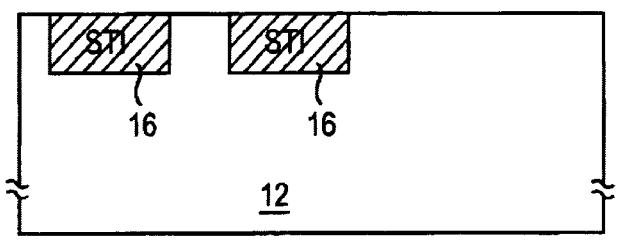

FIGS. 11A–11H are cross-sectional views of the steps in a method of forming a silicon diode of the present invention. Referring to FIG. 11A, a semiconductor substrate 12 is prepared and defined. In one embodiment, semiconductor substrate 12 is a p-type substrate. FIG. 11B shows the formation of STIs 16 inside semiconductor substrate 12. In general, STIs are formed by providing a mask over a substrate. After the mask is patterned and defined, the semiconductor substrate is etched to form shallow trenches spaced apart from one another. A dielectric material, such as silicon dioxide, silicon nitride or silicon oxynitride, is deposited to fill the trenches. The mask is then removed.

Figure 11C:
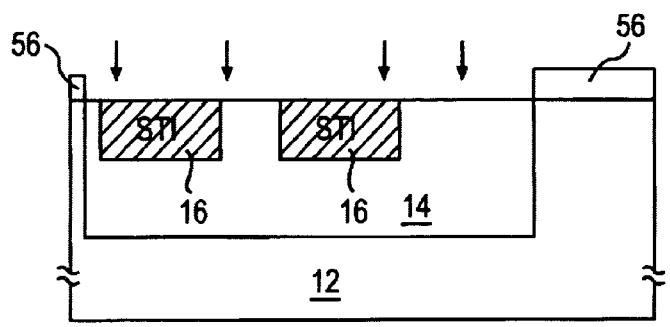

FIG. 11C shows an implantation of impurities to form a well region. Referring to FIG. 11C, after a photoresist 56 is patterned and defined, substrate 12 is doped with an impurity to form well 14. In one embodiment, substrate 12 is doped with an n-type impurity to form an n-well. After implantation, photoresist 56 is removed.

Figure 11D:
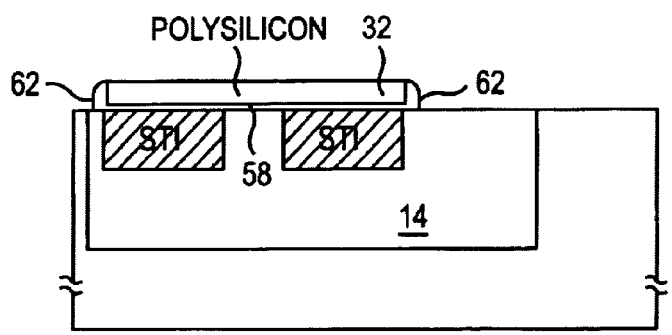

FIG. 11D shows the beginning of the formation of a silicon diode. Referring to FIG. 11D, a thin oxide layer 58 is grown over the surface of well region 14. A layer of silicon 32 is then deposited over oxide layer 58. A photoresist (not shown) is used to pattern and define silicon layer 32 during an etching process to form the structure shown in FIG. 11D. Conventional steps follow to form spacers 62 contiguous with silicon layer 32. Spacers 62 may be oxide spacers or nitride spacers.

Figure 11E:
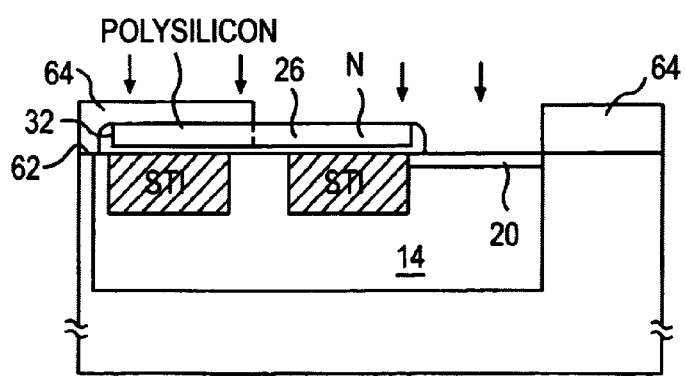

Referring to FIG. 11E, a photoresist 64 is deposited over silicon layer 32, spacers 62, well 14, and substrate 12, and then patterned and defined to expose a first portion 26 of silicon layer 32, a portion of silicon layer 32 that would later become center portion 28, and a portion of well 14. A lightly-doped drain (LDD) of an impurity is implanted into first portion 26, center portion 28, and the exposed portion of well 14. The implanted impurity forms a diffused region 20 in well region 14. Therefore, first portion 26 contains the same type of impurity as center portion 28 and diffused region 20. In one embodiment, an LDD of an n-type impurity is implanted into first portion 26, center portion 28, and diffused portion 20.

Figure 11F:
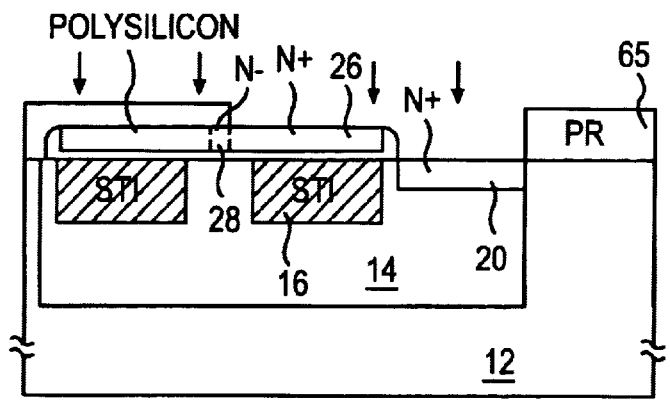

Referring to FIG. 11F, a photoresist 65 is deposited over silicon layer 32, spacers 62, well 14, and substrate 12, and then patterned and defined to expose first portion 26 and diffused region 20. A high concentration of the same type of impurity implanted in FIG. 11E is implanted into first portion 26 and diffused region 20. The high concentration implant of FIG. 11F provides a higher concentration than the LDD implant of FIG. 11E. Diffused region 20 is implanted with the same type of impurity as first portion 26. After the high concentration implantation, diffused region 20 diffuses further into well 14, and first portion 26 now contains a higher concentration of impurity. Therefore, center portion 28 contains a lower concentration of impurities than first portion 26. Photoresist 65 is then removed. In one embodiment, a high concentration of an n-type impurity is implanted, and first portion 26 becomes the n-portion of an SD.

Figure 11G:
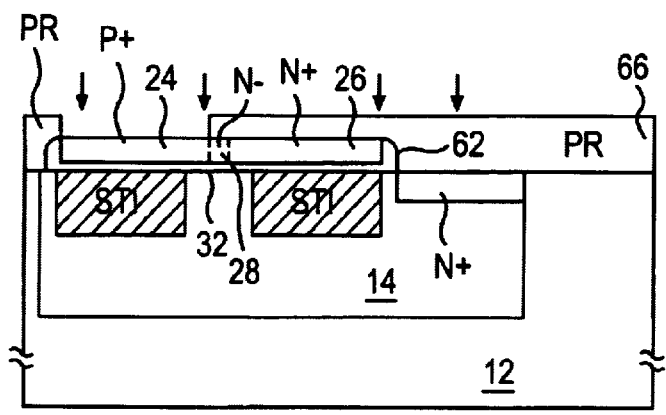
Figure 11H:
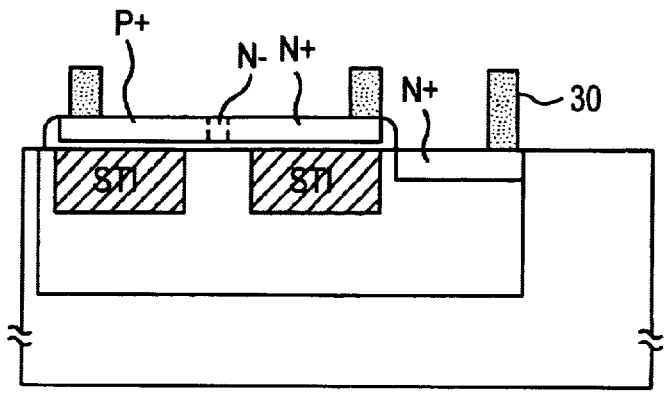

Referring to FIG. 11G, a photoresist 66 is deposited over silicon layer 32, spacers 62, well 14, and substrate 12. Photoresist 66 is patterned and defined to expose a second portion 24 of silicon layer 32. An impurity of a different type than the LDD and high concentration implants of FIGS. 11E and 11F is implanted into second portion 24. Second portion 24 is heavily doped with the different impurity. In one embodiment, second portion 24 is heavily doped with a p-type impurity and become the p-portion of an SD. Photoresist 66 is then removed. Referring to FIG. 11H, conventional semiconductor processing follows to form a plurality of contacts 30.

Figure 12A:
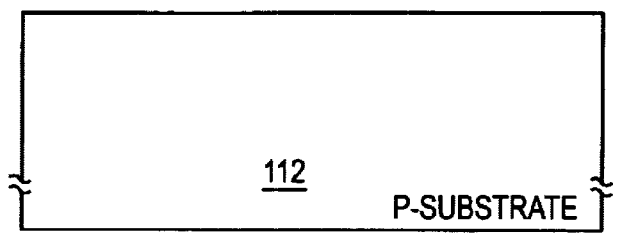
FIGS. 12A–12H are cross-sectional views of the steps in a method of forming a silicon diode with a p-type center region.
Figure 12B:
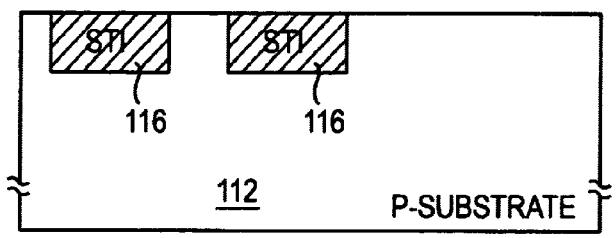
Figure 12C:
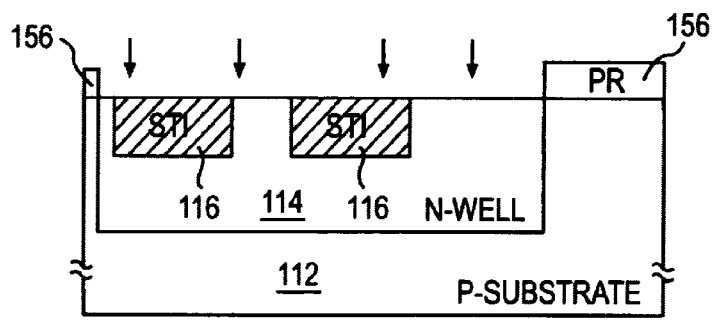

Similar to the method of forming an SD shown in FIGS. 11A–11H above, FIGS. 12A–12H are cross-sectional views of the steps in a method of forming a silicon diode with a p-type center region. Referring to FIG. 12A, a p-type semiconductor substrate 112 is prepared and defined. FIG. 12B shows the formation of STIs 116 inside semiconductor substrate 112. STIs 116 may be formed using the process steps described above. FIG. 12C shows an n-well implantation to form an n-well region. Referring to FIG. 12C, after a photoresist 156 is patterned and defined, substrate 112 is doped with an n-type impurity to form n-well 114. In addition, STIs 116 are now disposed inside n-well 114. After implantation, photoresist 156 is removed.

Figure 12D:
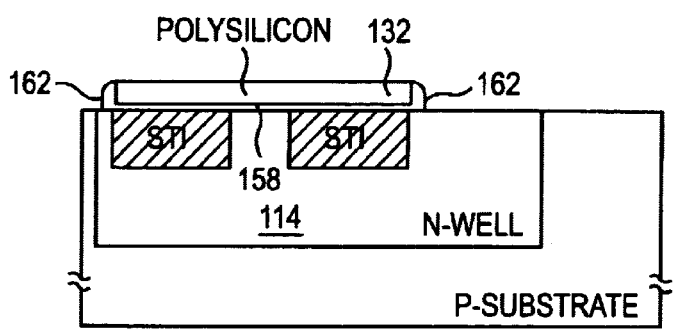

Referring to FIG. 12D, a thin oxide layer 158 is grown over the surface of n-well 114. A layer of silicon 132 is then deposited over oxide layer 158. A photoresist (not shown) is used to pattern and define polysilicon layer 132 during etching to form the structure shown in FIG. 12D. Conventional steps follow to form spacers 162 contiguous with polysilicon layer 132. Spacers 162 may be oxide spacers or nitride spacers.

Figure 12E:
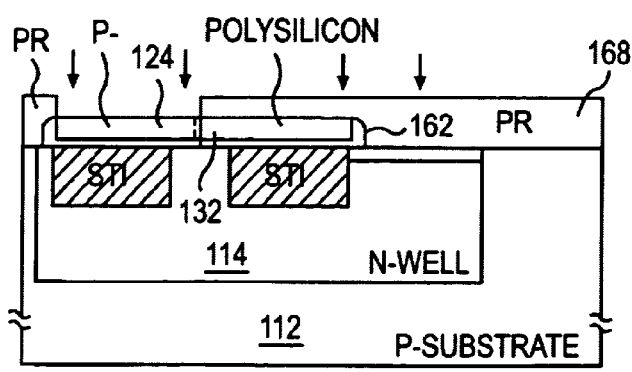

Referring to FIG. 12E, after a photoresist 168 is deposited over polysilicon layer 132, spacers 162, n-well 114, and substrate 112, photoresist 168 is patterned and defined to expose a second portion 124 of polysilicon layer 132. A p-type lightly-doped drain (LDD) is implanted into second portion 124. Photoresist 168 is removed after the implantation step.

Figure 12F:
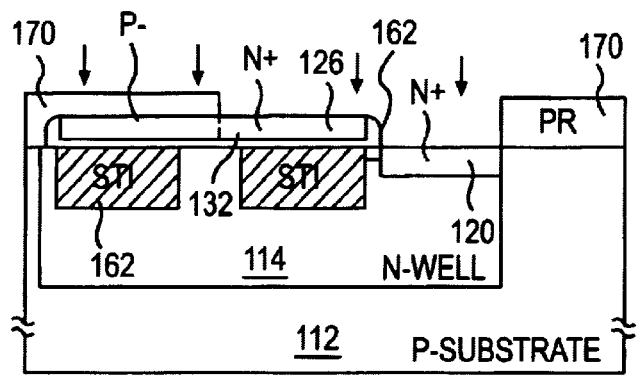

Referring to FIG. 12F, a photoresist 170 is deposited over polysilicon layer 132, spacers 162, n-well 114, and substrate 112. Photoresist 170 is patterned and defined to expose a first portion of polysilicon layer 126, a portion of polysilicon layer 132 that would later become a center portion 128, and a portion of n-well 114. A high-concentration n-type impurity is implanted into first portion 126, center portion 128, and the portion of n-well 114. Implanted portion of n-well 114 becomes an n-type diffused region 120. Photoresist 170 is then removed.

Figure 12G:
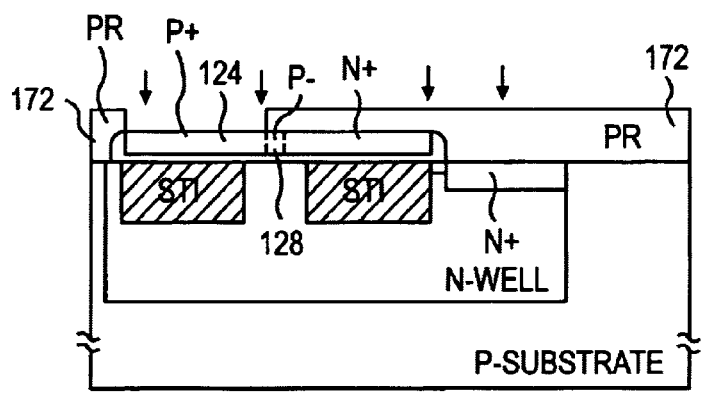
Figure 12H:
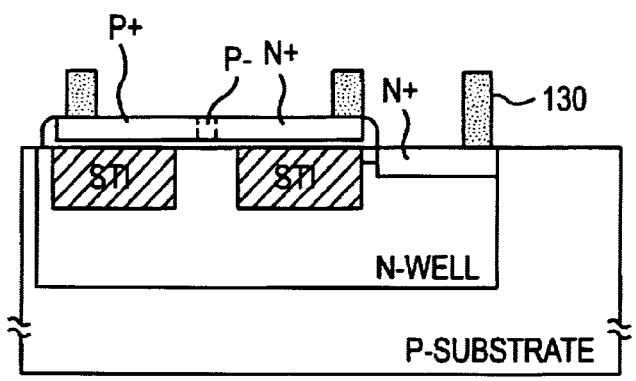

Referring to FIG. 12G, a photoresist 172 is laid down and patterned. Using photoresist 172 as a mask, a high concentration of a p-type impurity is implanted into second portion 124. The implantation concentration of the step shown in FIG. 12G is larger than that of the LDD implantation step shown in FIG. 12E. The p-portion 124 of an SD is formed and contains a higher impurity concentration than center region 128 of the SD. Photoresist 172 is then removed. Referring to FIG. 12H, conventional semiconductor processing follows to form a plurality of contacts 130.

For a silicon diode of the present invention manufactured using an SOI technology, a modification of the manufacturing processes described above will be required. However, the modification will be limited to the few steps at the beginning of the manufacturing process unrelated to the manufacturing steps for the formation of the silicon diode. With the exception of the steps related to the creating of a well region, the manufacturing steps described above follow to manufacture a silicon-on-insulator silicon diode of the present invention as described above.

Figure 13:
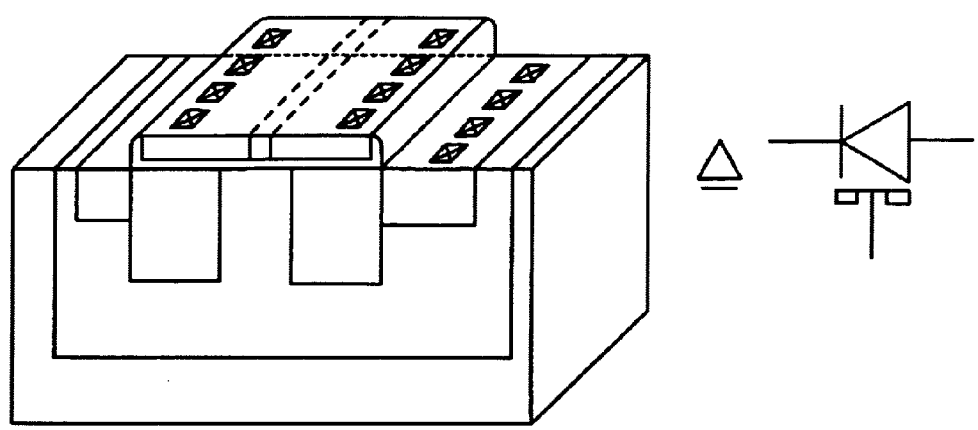
FIG. 13 shows the circuit symbol for the silicon diode of the present invention relative to the cross-sectional view of the diode.

FIG. 13 is a circuit symbol for an SD of the present invention relative to the cross-sectional view of the diode. All of the SDs shown in the subsequent drawings represented by the symbol of FIG. 13 may also be implemented with the SD shown in FIG. 8.

Figure 14:
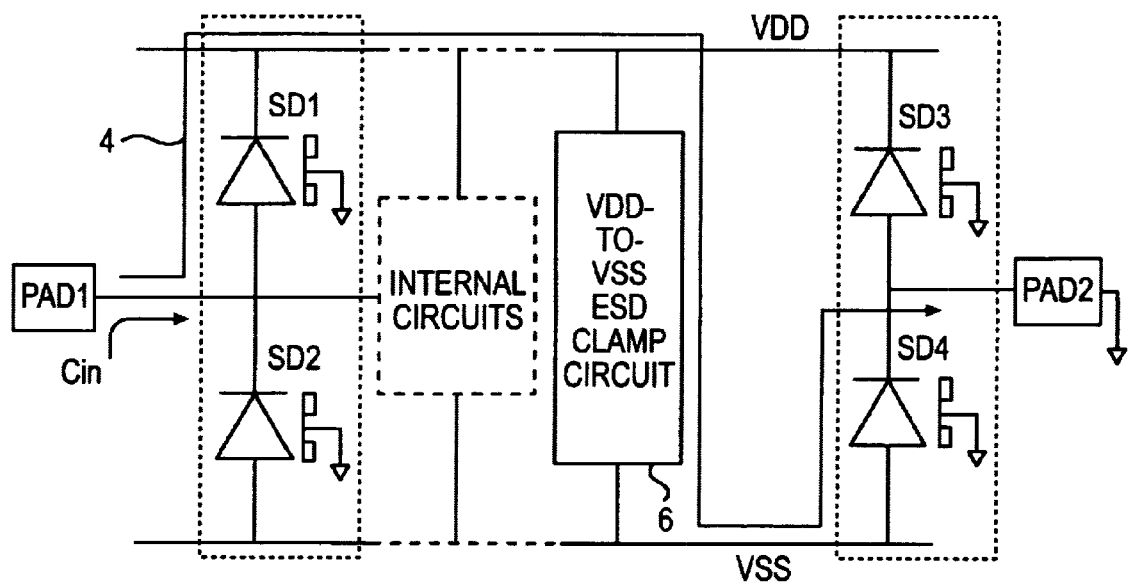
FIG. 14 is a circuit diagram of an ESD protection circuit with dual silicon diodes of the present invention.

FIG. 14 is a circuit diagram of an ESD protection circuit with two dual-SDs. The first dual SDs includes SD1 and SD2, and second dual SDs includes SD3 and SD4. Referring to FIG. 14, dual silicon diodes SD1 and SD2 are used in a forward-biased condition to discharge an ESD current so that the ESD current does not damage the internal circuits. When an ESD current 4 is applied to Pad1, and with Pad2 grounded relative to Pad1, an ESD current 4 is conducted to VDD through silicon diode SD1. ESD current 4 is then discharged to the VSS line through a VDD-to-VSS ESD clamp circuit 6 and flows out of the IC through SD4.

Therefore, the present invention also includes a method for protecting a CMOS semiconductor device from electrostatic discharge. The method provides a signal to the semiconductor device through a CMOS semiconductor circuit that includes at least one silicon diode to protect the semiconductor device from electrostatic discharge. Similarly, the present invention also includes a method for protecting a silicon-on-insulator semiconductor device from electrostatic discharge. The method provides a signal to the device through a silicon-on-insulator circuit that includes at least one silicon-on-insulator silicon diode to protect the semiconductor device from electrostatic discharge.

Figure 1A:
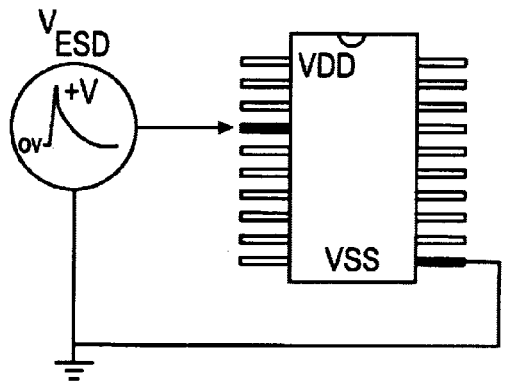
FIGS. 1A–1D show possible occurrences of an ESD event in an integrated circuit.
Figure 1B:
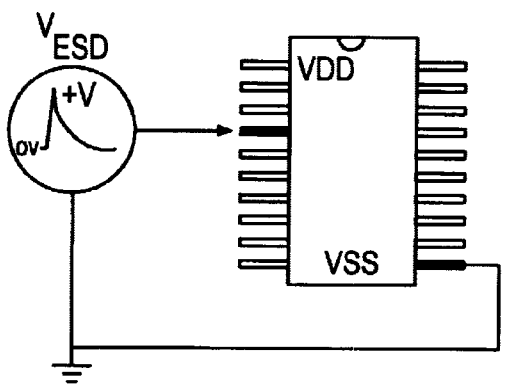
Figure 1C:
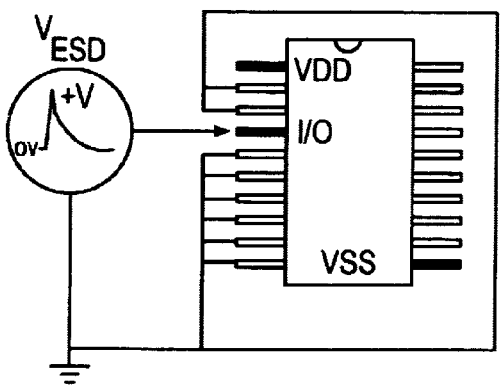
Figure 1D:
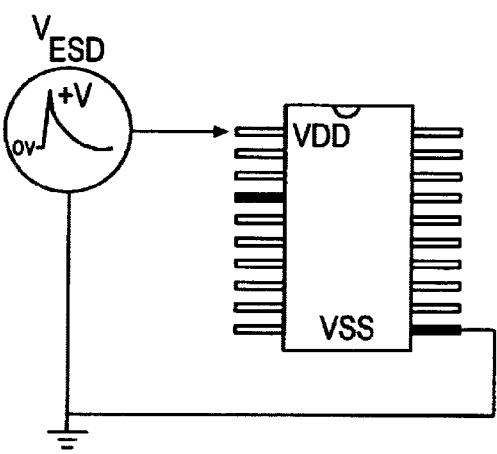
Figure 2:
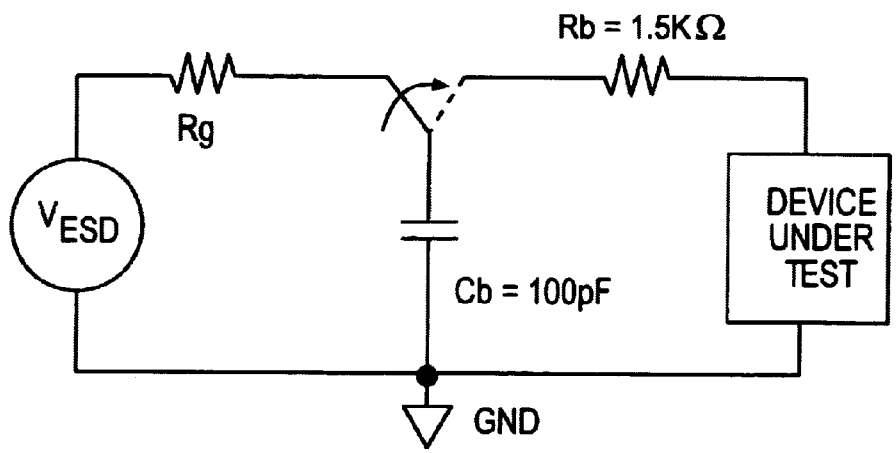
FIG. 2 shows a human body model ESD test circuit.
Figure 3:
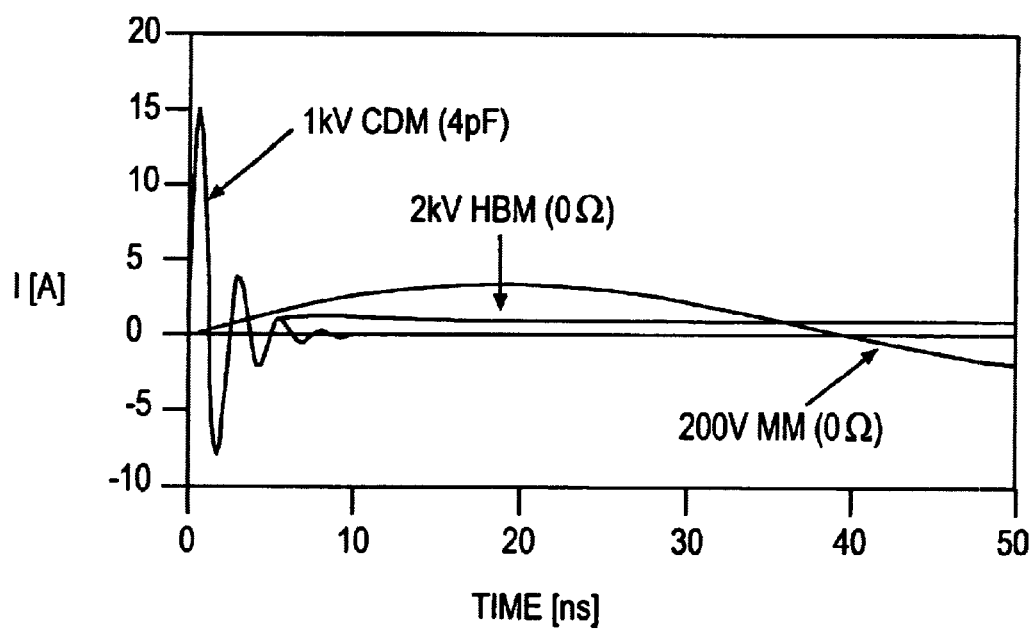
FIG. 3 is a plot that shows the characteristics of different types of ESD models.
Figure 4A:
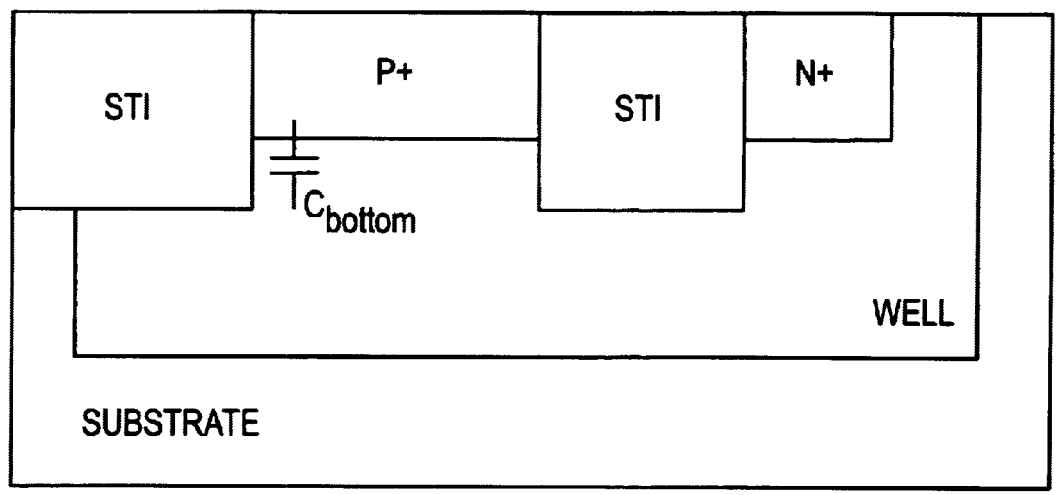
FIG. 4A shows a cross-sectional view of a known diode structure formed in an integrated circuit.
Figure 4B:
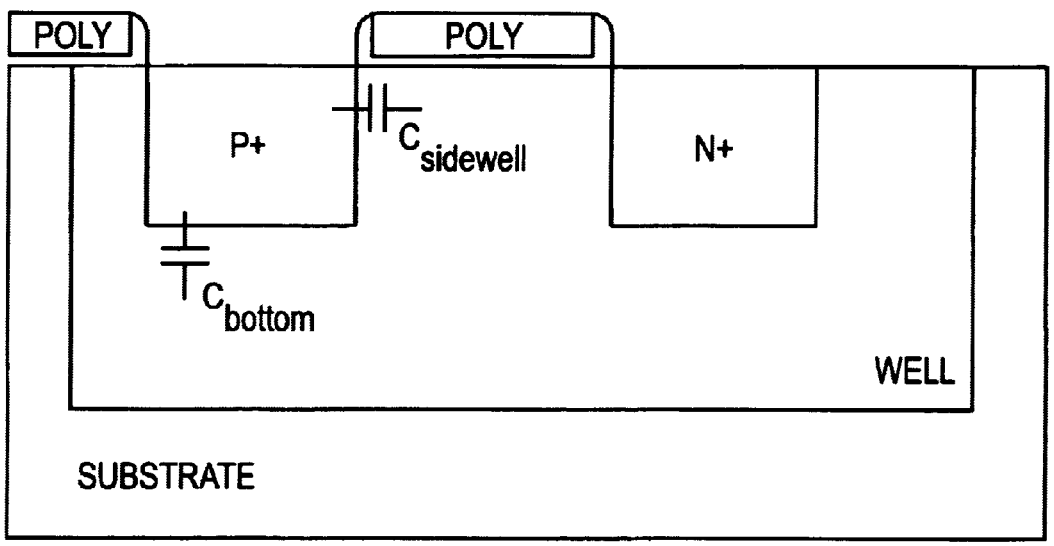
FIG. 4B shows a cross-sectional view of another known diode structure formed in an integrated circuit.
Figure 5:
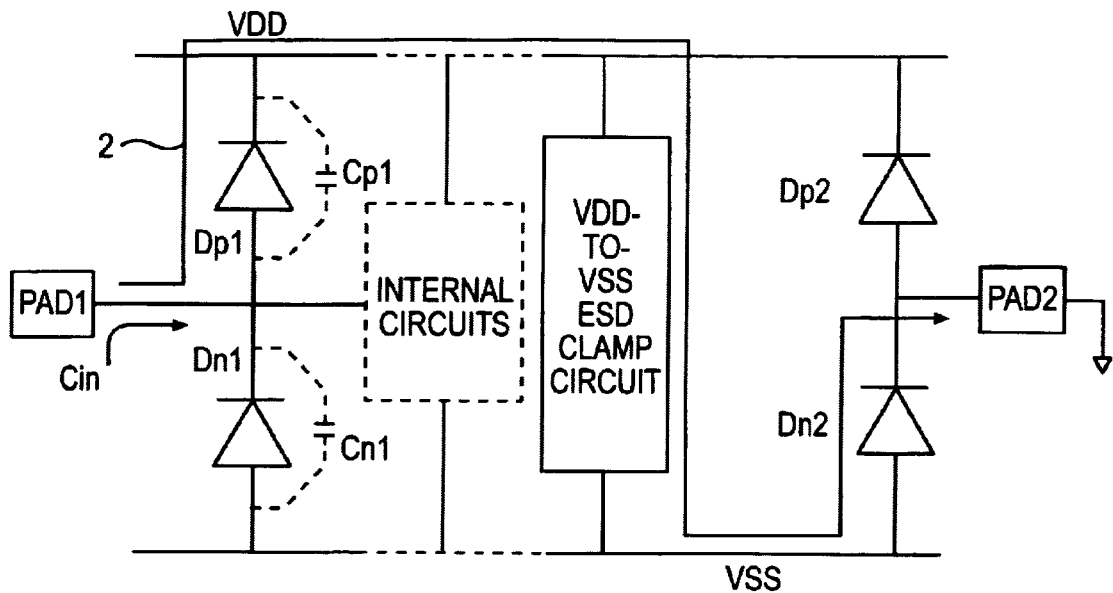
FIG. 5 is a circuit diagram of a known ESD protection circuit.
Figure 6:
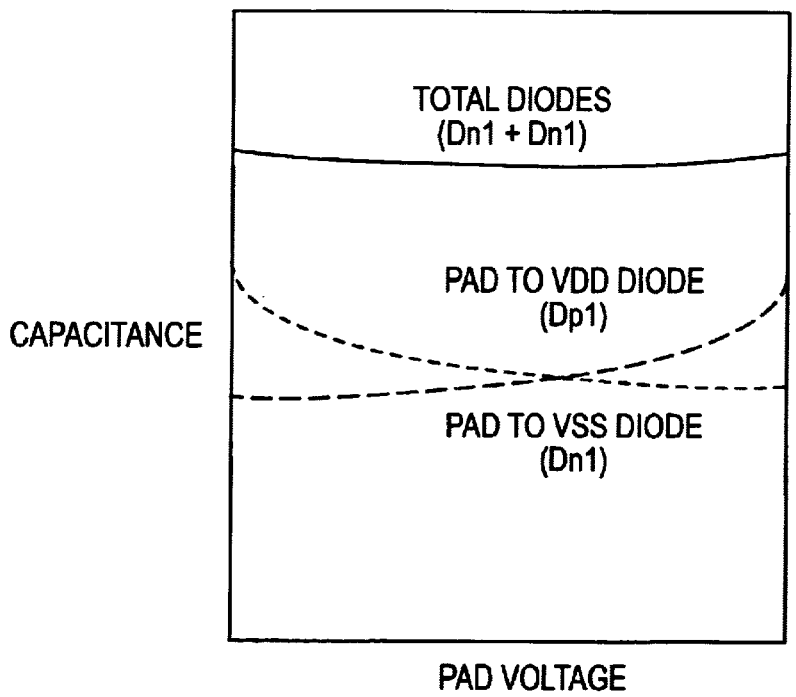
FIG. 6 is plot showing the relationship between a pad voltage and parasitic input capacitance of the circuit shown in FIG. 5.
Figure 15A:
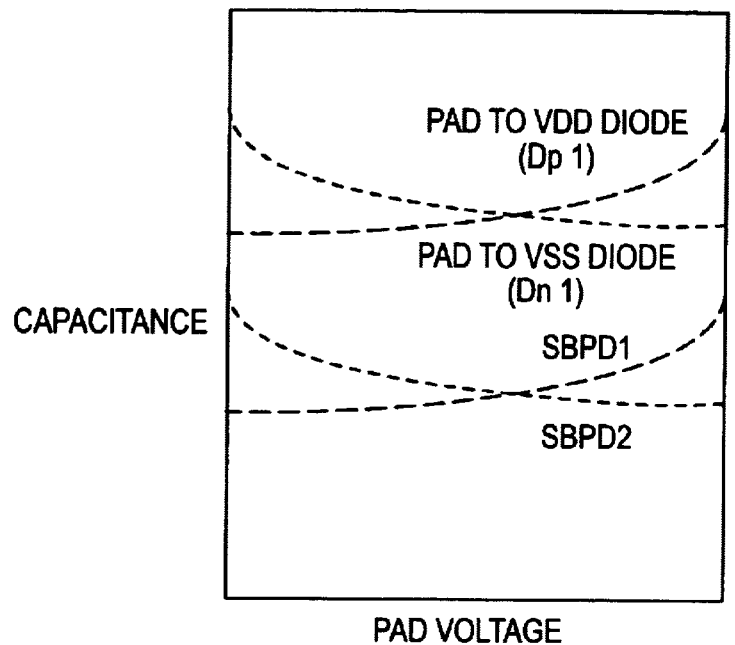
FIG. 15A is plot showing the relationship between a pad voltage and individual parasitic input capacitance of the dual silicon diodes of FIG. 14.
Figure 15B:
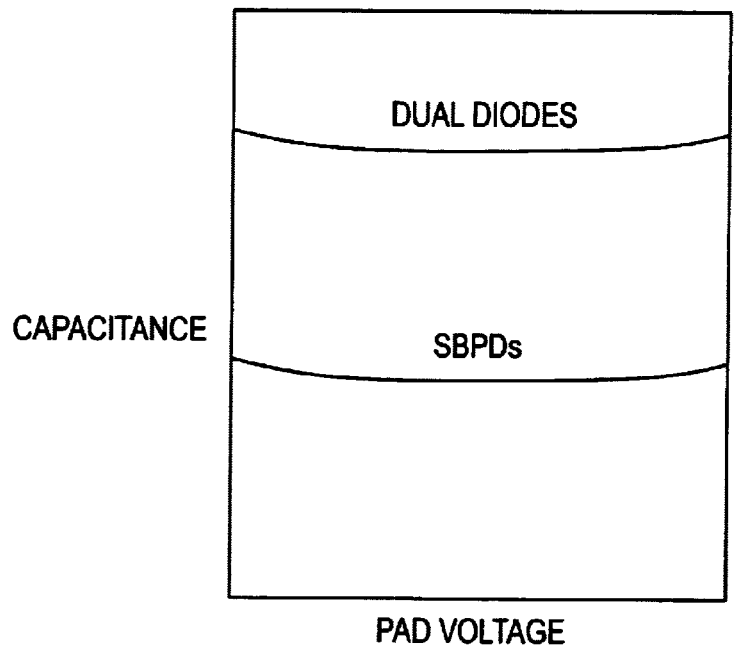
FIG. 15B is plot showing the relationship between a pad voltage and total parasitic input capacitance of the dual silicon diodes of FIG. 14.

FIG. 15A is plot showing the relationship between a pad voltage and individual parasitic input capacitance of the dual silicon diodes of FIG. 14. When the n-well region of an SD is biased to ground, the parasitic capacitance of the SD is approximately half of the polysilicon-bound diode of FIG. 4B because, unlike a polysilicon-bound diode, an SD does not have a bottom junction capacitance, $C_{bottom}$. As shown in FIG. 15A, the capacitance variation of an SD relative to pad voltages is similar to that of a polysilicon-bound diode as shown in FIG. 6. Therefore, the total input capacitance $C_{in}$ of the dual SDs of FIG. 14 is also approximately half of the dual polysilicon-bound diodes. This relationship is shown in FIG. 15B.

Figure 16C:
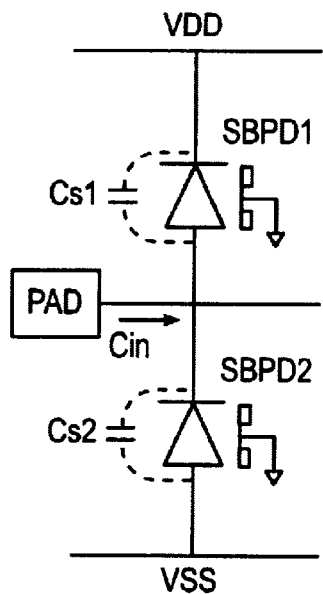
FIG. 16C is a circuit diagram of another embodiment of an ESD protection circuit using stacked silicon diodes of the present invention.
Figure 16C:
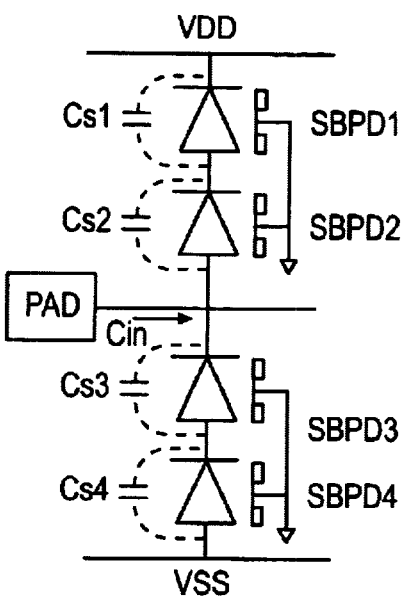
Figure 16C:
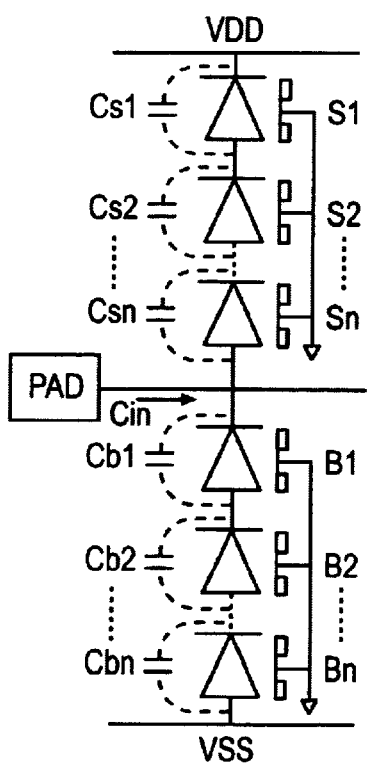

The input parasitic capacitance of SDs may be further reduced by connecting a plurality of SDs in series because capacitances connected in series lower the total capacitance. FIG. 16A is a circuit diagram of one embodiment of an ESD protection circuit using dual SDs. Assuming each of the SDs has the same capacitance C, the total capacitance for FIG. 16A is 2C. FIG. 16B is a circuit diagram of one embodiment of an ESD protection circuit using two dual-SDs. The total capacitance for FIG. 16B is C. FIG. 16C is a circuit diagram of another embodiment of an ESD protection circuit using dual SD strings. The total capacitance for FIG. 16C is 2C/n, wherein n represents the number of SDs.

Figure 17:
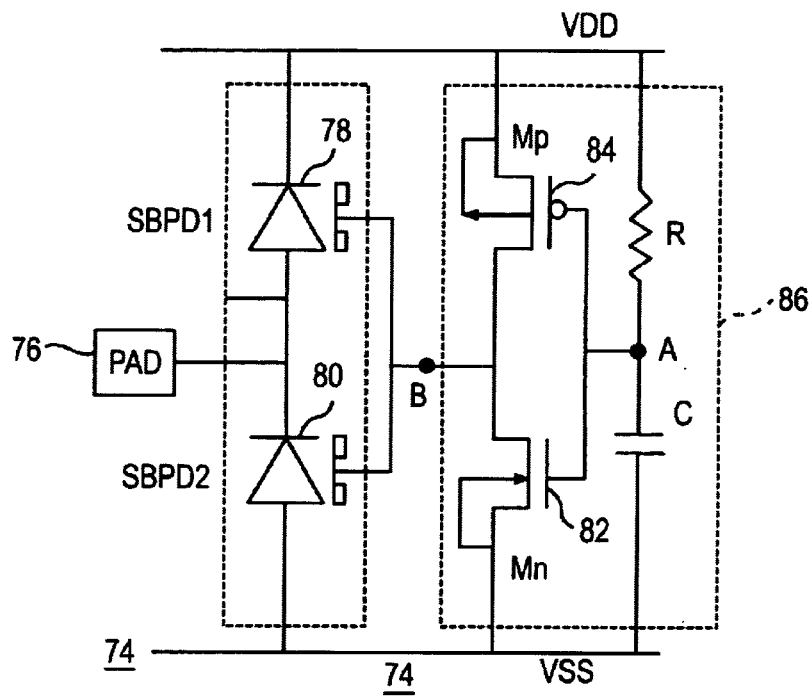
FIG. 17 is a circuit diagram of one embodiment of an ESD protection circuit with biased dual silicon diodes of the present invention.

FIG. 17 is a circuit diagram of one embodiment of an ESD protection circuit with biased dual SDs of the present invention. Referring to FIG. 17, an integrated circuit device 74 receives signals from a signal pad 76. Device 74 includes a pair of SDs 78 and 80, responsive to the signals from signal pad 76 for providing electrostatic discharge protection from the signals. Each of SDs 78 and 80 includes a p-portion and an n-portion (not numbered) and signal pad 76 is coupled to the p-portion of one of the pair of SDs and the n-portion of the other one of the pair of SDs. In one embodiment of the invention as shown in FIG. 14, device 74 additionally comprises a second pair of SDs, SD3 and SD4, coupled to clamp circuit 6. In another embodiment as shown in FIG. 16C, each of the pair of SDs 78 and 80 of FIG. 17 includes a plurality of serially coupled SDs.

Referring again to FIG. 17, device 74 further comprises a detection circuit 86 for detecting signals from signal pad 76 and providing a bias voltage to SDs 78 and 80. In one embodiment, an integrated circuit that receives electrostatic charges from a signal pad comprises a plurality of serially coupled SDs responsive to the electrostatic pulses from the signal pad for providing electrostatic discharge protection from the signals. Detection circuit 78 comprises a resistor-capacitor (R-C) circuit having a delay constant longer than the duration of the electrostatic pulses. The resistor-capacitor circuit is coupled in parallel with a transistor network. The transistor network comprises a first transistor 84, and a second transistor 82, and each of the transistors includes a gate, source and drain. The gate of first transistor 84 is coupled to the gate of second transistor 82 and the resistor-capacitor circuit. In addition, the drain of first transistor 84 and the drain of the second transistor 82 are coupled to a substrate of SDs 78 and 80. The source of first transistor 84 is coupled to a VDD signal and the source of second transistor 82 is coupled to a VSS signal. In operation, the drain of first transistor 84 and the drain of the second transistor 82 are coupled to the substrate of SDs 78 and 80 to provide a bias voltage.

The bi-directional silicon diode of the present invention includes one pair of silicon diodes, wherein an n-type portion of the first silicon diode is coupled to a p-type portion of the second silicon diode and a p-type portion of the first silicon diode is coupled to an n-type portion of the second silicon diode such that the bi-directional silicon diode is responsive to either a positive electrostatic discharge or a negative electrostatic discharge. In addition, the bi-directional silicon diode may include as many as n pairs of similarly-coupled silicon diodes coupled in series, wherein n equals to an integer between 1 and infinity. Furthermore, the number of silicon diodes coupled in series that constitutes one direction of the bi-directional silicon diode does not need to be the same as the number of silicon diodes coupled in series in the other direction of the bi-directional silicon diode. In other words, the bi-directional silicon diode may include, for example, one silicon diode coupled in parallel with two serially-coupled diodes.

Figure 18:
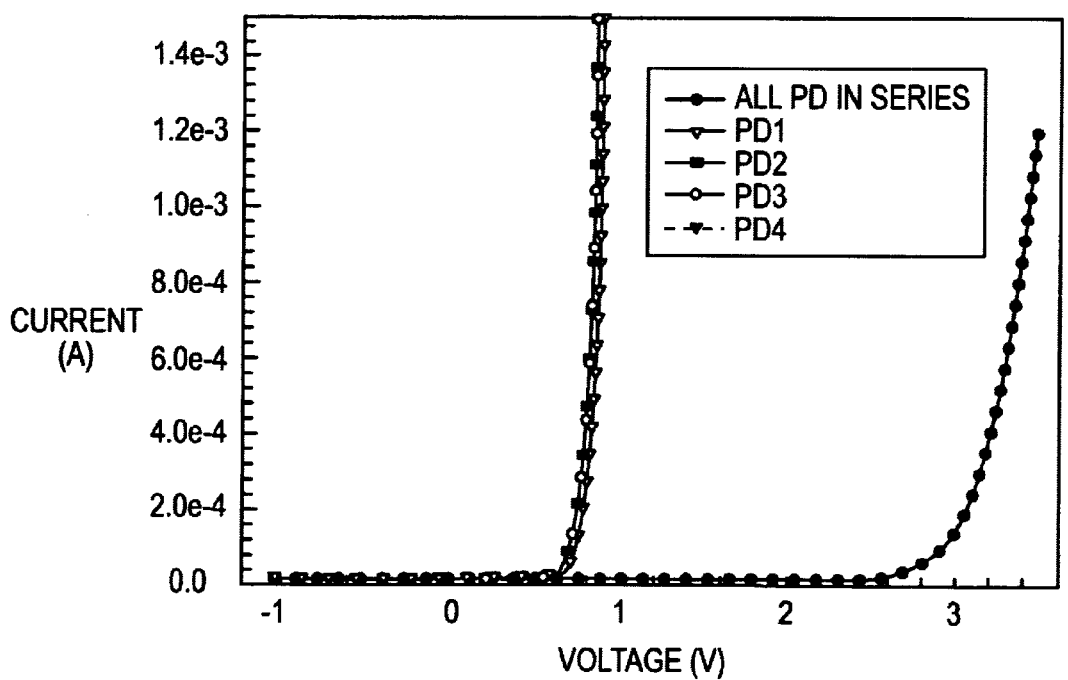
FIG. 18 is a plot showing the current to voltage characteristics of the bi-directional silicon diodes.

FIG. 18 is a plot showing the current to voltage characteristics of the bi-directional silicon diode within a certain range of voltages and currents. The x-axis represents the trigger voltage level of a bi-directional silicon diode, and the y-axis represents the current flow. FIG. 18 shows the current to voltage characteristics of four bi-directional silicon diodes, PD1, PD2, PD3 and PD4, and the current to voltage characteristics when all four diodes are coupled in series. It is clear that the current to voltage characteristics of bi-directional silicon diodes are consistent and not distorted. In addition, the trigger, or turn-on, voltage of the serially coupled bi-directional silicon diodes depends on the number of diodes coupled in series.

Figure 19:
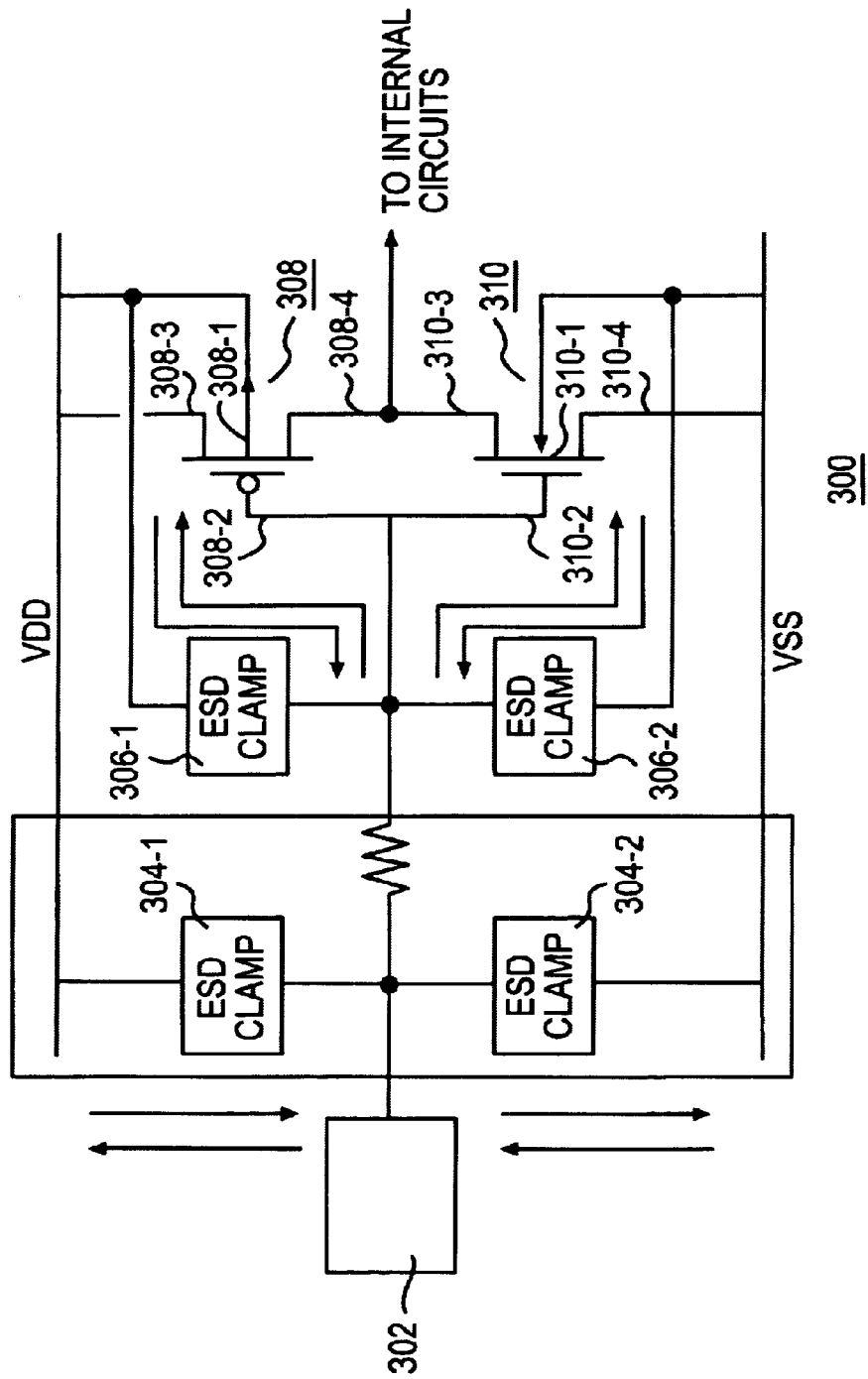
FIG. 19 is a circuit diagram of one embodiment of an ESD protection scheme using the bi-directional silicon diode of the present invention.

FIG. 19 is a circuit diagram of an embodiment of an ESD protection scheme using a plurality of bi-directional silicon diodes of the present invention. Referring to FIG. 19, an integrated circuit 300 includes a signal pad 302 for receiving an input signal, ESD protection circuits 304-1, 304-2, 306-1 and 306-2, a PMOS transistor 308 and an NMOS transistor 310. Transistor 308 includes a bulk 308-1, a gate 308-2, a source 308-3 coupled to a voltage source VDD, and a drain 308-4 coupled to internal circuits (not numbered). Transistor 310 includes a bulk 310-1, a gate 310-2, a drain 310-3, and a source 310-4 coupled to a voltage source VSS. Drain 308-4 is coupled to drain 310-3. ESD protection circuit 304-1 is coupled to signal pad 302 and voltage source VDD, and ESD protection circuit 304-2 is coupled to signal 302, ESD protection circuit 304-1 and voltage source VSS. ESD protection circuit 306-1 is coupled to bulk 308-1 of transistor 308, and gate 308-2 of transistor 308. ESD protection circuit 306-2 is coupled to gate 310-2 of transistor 310, and bulk 310-1 of transistor 310. Signal pad 302 may be an input pad, an output pad, a power pad, or any other pad that may come into contact with HBM, MM and CDM electrostatic discharges. The arrows represent possible direction flows of ESD currents when the ESD protection circuits 304-1, 304-2, 306-1 and 306-2 are triggered.

In operation, ESD protection circuits 304-1 and 304-2 serve as ESD clamps to protect integrated circuit 300 from an electrostatic discharge received by signal pad 302, and such an ESD event may be caused by HBM and MM. ESD protection circuits 306-1 and 306-2 serve as ESD clamps to protect transistors 308 and 310 from an ESD event, which could be caused by CDM. Each of the ESD protection circuits 304-1, 304-2, 306-1 and 306-2 includes at least one bi-directional SD of the present invention. As implemented, the ESD protection circuits would provide protection to the internal circuits for ESD events originated external to integrated circuit 300, i.e., HBM and MM, and internal to the integrated circuit 300, i.e., CDM.

In one embodiment, each of the ESD protection circuits includes a plurality of serially coupled bi-directional SDs of the present invention. The number of serially coupled bi-directional SDs that should be implemented depends on the voltage-blocking requirement of a particular circuit. For example, if the maximum signal voltage provided to signal pad 302 is 3 volts in normal operations, the voltage-blocking requirement may be set a 4.5 volts to ensure that the ESD protection circuits do not interfere with the normal circuit operations. Assuming the threshold voltage for each SD is 0.6 volts, 8 silicon diodes with a total blocking-voltage of 4.2 volts may be implemented in the forward-bias condition from signal pad 302 to VSS. Conversely, only one SD would be needed in the reverse-bias condition from signal pad 302 to VSS because the breakdown voltage of the SD is greater than the signal voltage.

Referring to FIG. 14, the VDD-to-VSS ESD clamp circuit 6 may also be implemented with the SDs of the present invention in integrated circuit 300 of FIG. 19 to further improve ESD robustness.

Figure 20:
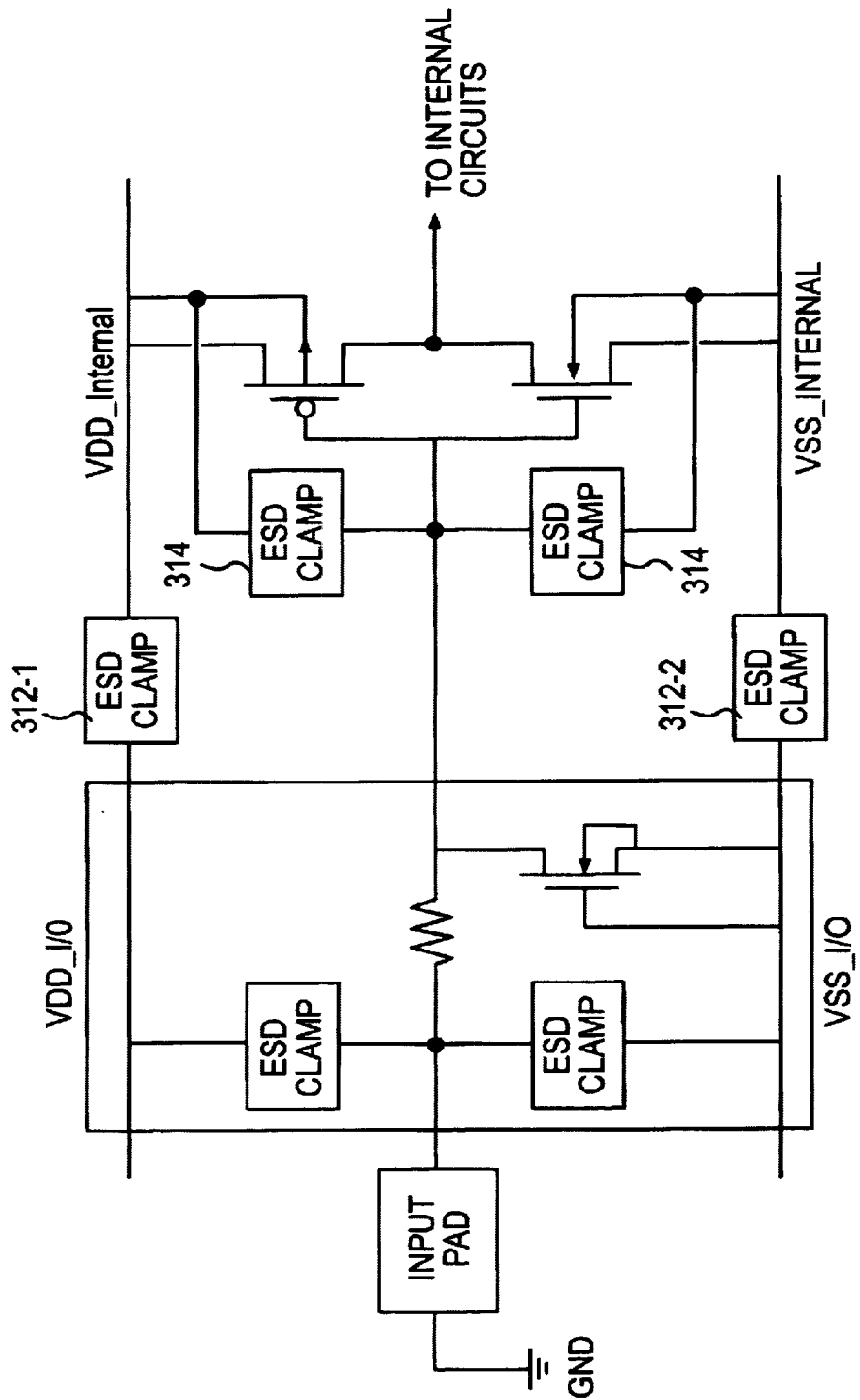
FIG. 20 is a circuit diagram of one embodiment of an ESD protection scheme using the bi-directional silicon diode of the present invention.

FIG. 20 is a circuit diagram of another embodiment of an ESD protection scheme using the bi-directional silicon diode in an ESD protection circuit, or ESD clamp, of the present invention in multi-power applications. In a multi-power application, isolation of power lines not only diminishes noise, but also ESD robustness because the ESD current cannot be bypassed between the power lines. In accordance with the present invention, the bi-directional silicon diodes may be used to connect the two isolated power lines having different voltage levels to rebuild an ESD current path while still provides noise isolation. Referring to FIG. 20, ESD protection circuit 312-1 couples an external VDD voltage source VDD__I/O to internal VDD voltage source VDD__Internal, and ESD protection circuit 312-2 coupled an external VSS voltage source VSS__I/O to internal VSS voltage source VSS__Internal to provide ESD protection in a multi-power application. ESD protection circuits 314 provide similar ESD protection as ESD protection circuits 306-1 and 306-2 of FIG. 19.

Figure 21:
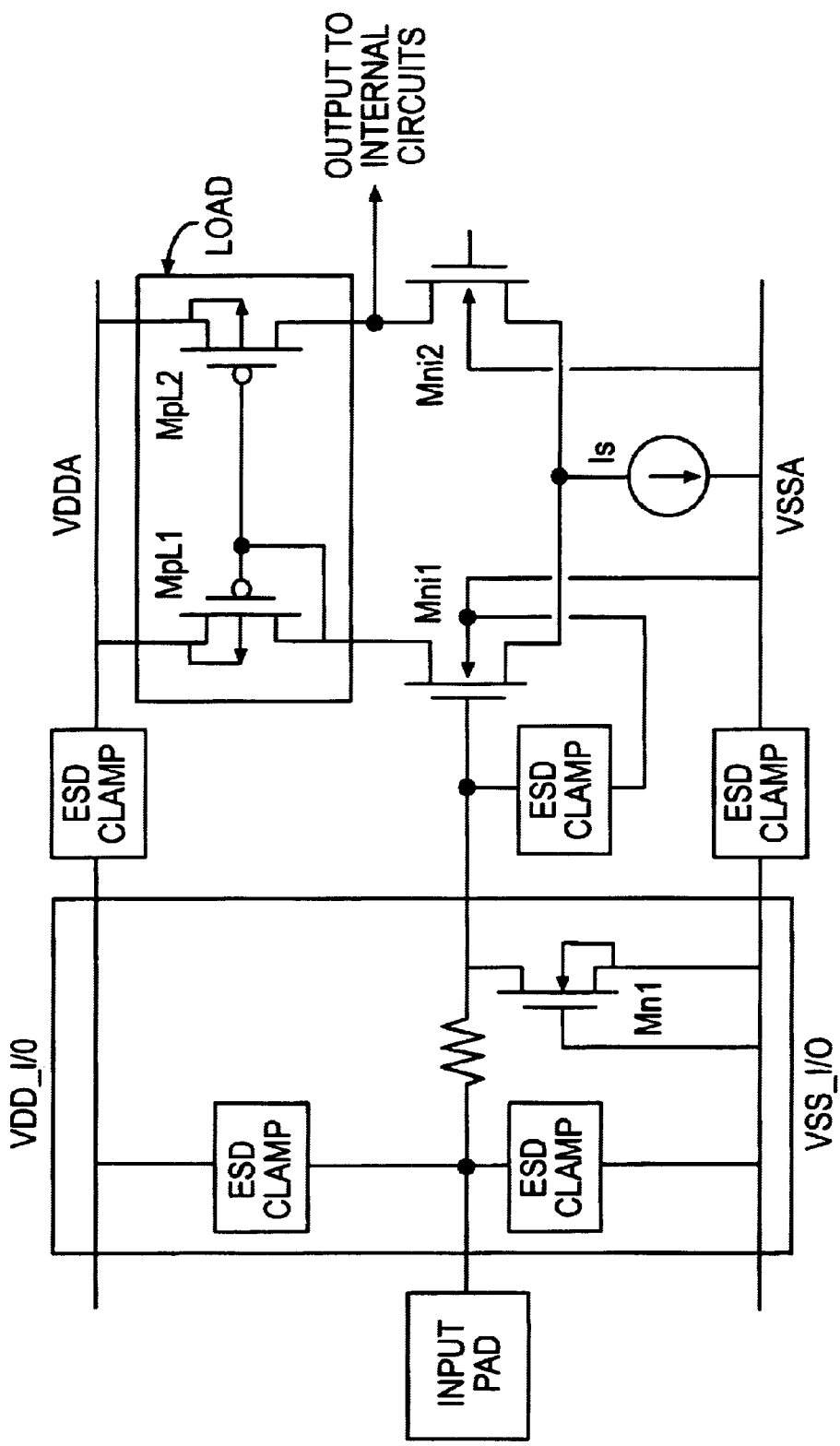
FIG. 21 is a circuit diagram of another embodiment of an ESD protection scheme using the bi-directional silicon diode of the present invention.
Figure 22:
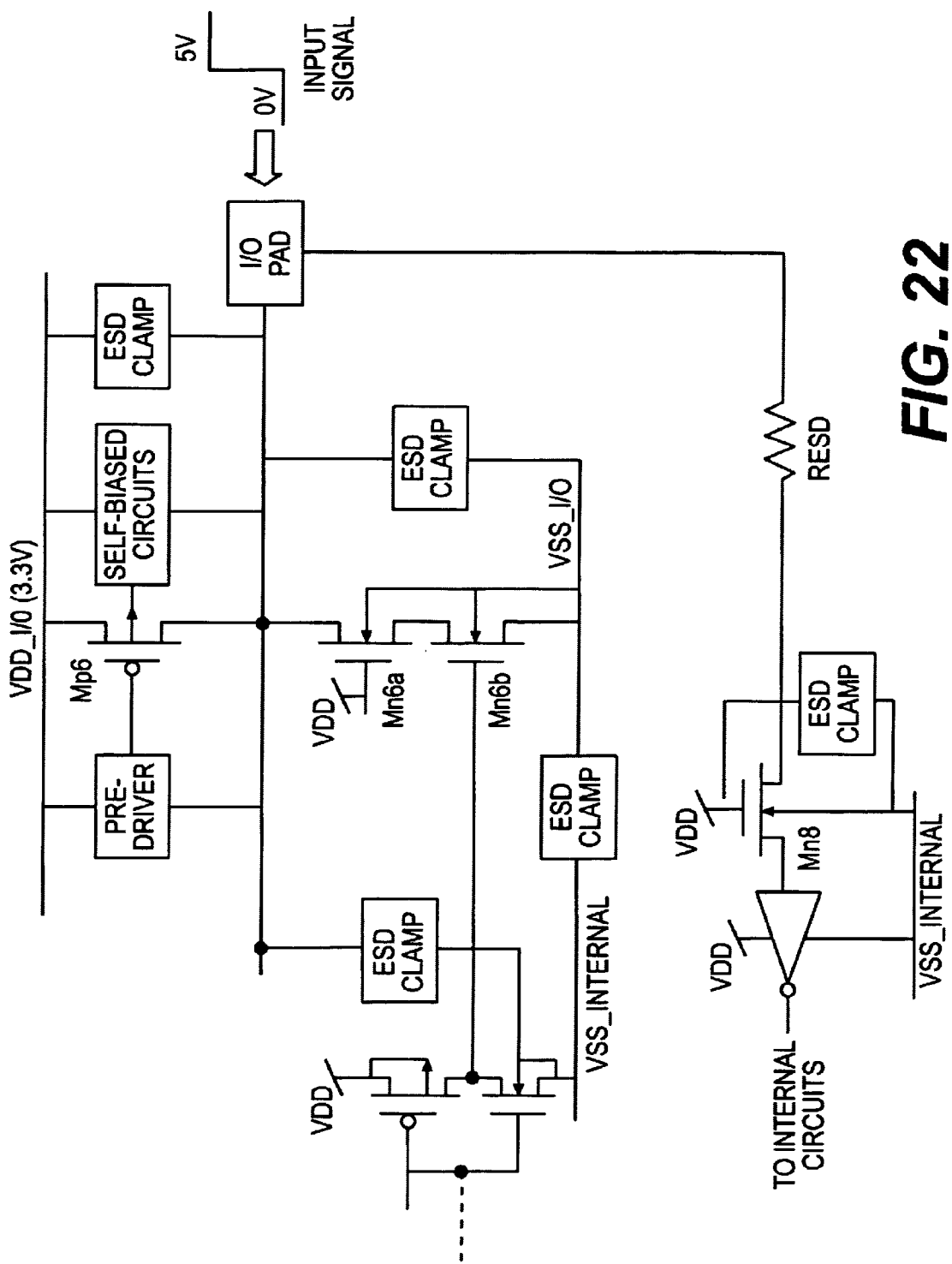
FIG. 22 is a circuit diagram of an embodiment of an ESD protection scheme using the bi-directional silicon diode of the present invention.

Similarly, the bi-directional silicon diodes may also be implemented in an ESD clamp circuit inside an analog circuit to provide ESD protection as shown in FIG. 21. The bi-directional silicon diodes may additionally be implemented in ESD clamp circuits inside a high-voltage tolerant I/O circuit as shown in FIG. 22. Such high-voltage tolerant I/O circuits are known and have been described in "A Versatile 3.3/2.5/1.8-V CMOS I/O Driver Built in a 0.2-$\mu$m, 3.5-nm Tox, 1.8-V CMOS Technology," by Sanchez et al., *IEEE Journal of Solid-State Circuits*, Vol. 34, No. 11, pp. 1501–11 (November 1999), and "High-Voltage-Tolerant I/O Buffers with Low-Voltage CMOS Process," by Singh et al, Id. at pp. 1512–25, and are incorporated by reference.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrostatic discharge protection circuit, comprising:

at least one bi-directional silicon diode having a first silicon diode and a second silicon diode, wherein an n-type portion of the first silicon diode is coupled to a p-type portion of the second silicon diode and a p-type portion of the first silicon diode is coupled to an n-type portion of the second silicon diode, and wherein the at least one bi-directional silicon diode is responsive to one of a positive electrostatic discharge or a negative electrostatic discharge.

2. The circuit as claimed in claim 1, wherein the at least one bi-directional silicon diode includes one or more serially coupled bi-directional silicon diodes.

3. The circuit as claimed in claim 1, wherein the first silicon diode includes a center silicon portion disposed between and contiguous with the p-type and n-type silicon portions of the first silicon diode.

4. The circuit as claimed in claim 1, wherein the second silicon diode includes a center silicon portion disposed between and contiguous with the p-type and n-type silicon portions of the second silicon diode.

5. The circuit as claimed in claim 1 further comprising,
a first isolation structure, and
a second isolation structure spaced apart from the first isolation structure,
wherein the p-type silicon portion of the first silicon diode overlaps the first isolation structure and the n-type silicon portion of the first silicon diode overlaps the second isolation structure.

6. The circuit as claimed in claim 5, further comprising a diffused region inside a well region adjacent one of the first isolation structure and second isolation structure, wherein the diffused region is doped with a same impurity as the well region.

7. The circuit as claimed in claim 1 further comprising,
a third isolation structure, and
a fourth isolation structure spaced apart from the third isolation structure,
wherein the p-type silicon portion of the second silicon diode overlaps the third isolation structure and the n-type silicon portion of the second silicon diode overlaps the fourth isolation structure.

8. The circuit as claimed in claim 7, further comprising a diffused region inside a well region adjacent one of the third isolation structure and fourth isolation structure, wherein the diffused region is doped with a same impurity as the well region.

9. The circuit as claimed in claim 1, wherein the first silicon diode includes n serially coupled silicon diodes and the second silicon diode includes m serially coupled silicon diodes, and wherein n and m are integers between 1 and infinity.

10. The circuit as claimed in claim 9, wherein n does not equal to m.

11. An electrostatic discharge protection circuit, comprising:
at least one bi-directional silicon diode having a first silicon-on-insulator diode and a second silicon-on-insulator diode, wherein an n-type portion of the first silicon-on-insulator diode is coupled to a p-type portion of the second silicon-on-insulator diode and a p-type portion of the first silicon-on-insulator diode is coupled to an n-type portion of the second silicon-on-insulator diode, and
wherein the at least one bi-directional silicon diode is responsive to one of a positive electrostatic discharge or a negative electrostatic discharge.

12. The circuit as claimed in claim 11, wherein the at least one bi-directional silicon diode includes one or more serially coupled bi-directional silicon diodes.

13. An integrated circuit, comprising:
a signal pad;
a first voltage source; and
a first electrostatic discharge clamp circuit, coupled to the first voltage source, having at least one bi-directional silicon diode including a first silicon diode and a second silicon diode, wherein an n-type portion of the first silicon diode is coupled to a p-type portion of the second silicon diode and a p-type portion of the first silicon diode is coupled to an n-type portion of the second silicon diode, and
wherein the at least one bi-directional silicon diode is responsive to one of a positive electrostatic discharge or a negative electrostatic discharge.

14. The circuit as claimed in claim 13, wherein the at least one bi-directional silicon diode includes one or more serially coupled bi-directional silicon diodes.

15. The circuit as claimed in claim 13, wherein the first voltage source is VDD, and the first electrostatic discharge clamp circuit is coupled to the signal pad to protect the circuit from at least a human body model, charged device model or machine model electrostatic discharge.

16. The circuit as claimed in claim 15, further comprising,
a second electrostatic discharge clamp circuit having at least one bi-directional silicon diode including a third silicon diode and a fourth silicon diode,
wherein an n-type portion of the third silicon diode is coupled to a p-type portion of the fourth silicon diode and a p-type portion of the third silicon diode is coupled to an n-type portion of the fourth silicon diode, and
wherein the second electrostatic discharge clamp circuit is coupled to VDD and a bulk of a first transistor at one end and to a gate of the first transistor at another end to protect the first transistor from at least a charged device model electrostatic discharge.

17. The circuit as claimed in claim 13, wherein the first voltage source is VSS, and the first electrostatic discharge clamp circuit is coupled to the signal pad to protect the circuit from at least a human body model electrostatic discharge or machine model electrostatic discharge.

18. The circuit as claimed in claim 17, further comprising,
a second electrostatic discharge clamp circuit having at least one bi-directional silicon diode including a third silicon diode and a fourth silicon diode,
wherein an n-type portion of the third silicon diode is coupled to a p-type portion of the fourth silicon diode and a p-type portion of the third silicon diode is coupled to an n-type portion of the fourth silicon diode, and
wherein the second electrostatic discharge clamp circuit is coupled to VDD at one end and the signal pad and the first electrostatic discharge clamp circuit at another end.

19. The circuit as claimed in claim 13, wherein the first voltage source is VDD, and the first electrostatic discharge clamp circuit is coupled to a bulk at one end and to a gate at another end of a first transistor to protect the first transistor from at least a charged device model electrostatic discharge.

20. The circuit as claimed in claim 19, further comprising,
a second electrostatic discharge clamp circuit having at least one bi-directional silicon diode including a third silicon diode and a fourth silicon diode,
wherein an n-type portion of the third silicon diode is coupled to a p-type portion of the fourth silicon diode and a p-type portion of the third silicon diode is coupled to an n-type portion of the fourth silicon diode, and
wherein the second electrostatic discharge clamp circuit is coupled to VDD at one end and the signal pad at another end to protect the circuit from at least a human body model electrostatic discharge or machine model electrostatic discharge.

21. The circuit as claimed in claim 13, wherein the first voltage source is VSS, and the first electrostatic discharge clamp circuit is coupled to a bulk and the first voltage source at one end and to a gate at another end of a second transistor to protect the second transistor from at least a charged device model electrostatic discharge.

22. The circuit as claimed in claim 21, further comprising,
a second electrostatic discharge clamp circuit having at least one bi-directional silicon diode including a third silicon diode and a fourth silicon diode,
wherein an n-type portion of the third silicon diode is coupled to a p-type portion of the fourth silicon diode and a p-type portion of the third silicon diode is coupled to an n-type portion of the fourth silicon diode, and
wherein the second electrostatic discharge clamp circuit is coupled to VDD and a bulk at one end and to a gate at another end of a first transistor.

23. The circuit as claimed in claim 22, in which a drain of the first transistor is coupled to a drain of the second transistor.

24. The circuit as claimed in claim 13, further comprising a second voltage source coupled to the first electrostatic discharge clamp circuit at a different end than the first voltage source, wherein the first voltage source is VDD and the second voltage source is VSS for providing electrostatic discharge protection.

25. The circuit as claimed in claim 13, further comprising a third voltage source coupled to the first electrostatic discharge clamp circuit, wherein the first voltage source provides a different voltage than that of the third voltage source.

26. The circuit as claimed in claim 25, wherein the third voltage source provides an input/output VDD voltage and the first voltage source provides a VDD voltage internal to the circuit.

27. The circuit as claimed in claim 25, wherein the third voltage source provides an input/output VSS voltage and the first voltage source provides a VSS voltage internal to the circuit.

28. The circuit as claimed in claim 1 further comprising,
a first voltage source, and
a second voltage source,
wherein the first voltage source is coupled to one end and the second voltage source is coupled to another end of the at least one bi-direction silicon diode, and
wherein the first voltage source is VDD and the second voltage source is VSS.

* * * * *